(12) United States Patent
Asnaashari

(10) Patent No.: US 9,524,210 B1
(45) Date of Patent: Dec. 20, 2016

(54) SEPARATING BITS REPRESENTED BY A MLC IN CONNECTION WITH ECC

(71) Applicant: Crossbar, Inc., Santa Clara, CA (US)

(72) Inventor: Mehdi Asnaashari, Danville, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/635,385

(22) Filed: Mar. 2, 2015

(51) Int. Cl.
| | |
|---|---|
| *H03M 13/29* | (2006.01) |
| *G11C 29/04* | (2006.01) |
| *G11C 11/56* | (2006.01) |
| *G06F 11/10* | (2006.01) |

(52) U.S. Cl.
CPC .......... *G06F 11/1068* (2013.01); *G06F 11/10* (2013.01); *G06F 11/1044* (2013.01); *H03M 13/2906* (2013.01); *G06F 11/1072* (2013.01); *G11C 11/5628* (2013.01); *G11C 2029/0411* (2013.01); *G11C 2211/5641* (2013.01)

(58) Field of Classification Search
CPC .................. G11C 11/5628; G11C 2211/5641; G11C 2029/0411; G06F 11/1072; G06F 11/10; G06F 11/1044
USPC .................................................. 714/755, 773
See application file for complete search history.

(56) References Cited

U.S. PATENT DOCUMENTS

| | | | | |
|---|---|---|---|---|
| 7,961,488 | B2* | 6/2011 | Abraham ............ | G11C 11/5628 365/12 |
| 8,902,652 | B1* | 12/2014 | Huang ................ | G11C 11/5628 365/185.03 |
| 9,047,214 | B1* | 6/2015 | Northcott .............. | G06F 11/108 |
| 9,058,900 | B2* | 6/2015 | Kang .................. | G11C 11/5635 |
| 9,263,136 | B1* | 2/2016 | Zhao ...................... | G11C 16/10 |
| 2009/0070748 | A1* | 3/2009 | Lin ....................... | G06F 11/1441 717/130 |
| 2013/0024605 | A1* | 1/2013 | Sharon ................ | G06F 11/1072 711/103 |
| 2014/0281819 | A1* | 9/2014 | Wood ................... | G11C 16/349 714/773 |
| 2015/0089324 | A1* | 3/2015 | Chandrasekhar ... | G06F 11/1072 714/766 |

* cited by examiner

*Primary Examiner* — James C Kerveros
(74) *Attorney, Agent, or Firm* — Amin, Turocy & Watson, LLP

(57) ABSTRACT

Two-terminal memory can be configured as multi-level cell (MLC) memory in which a single memory cell can represent multiple bits of information. Unlike certain other memories that are subject to disturb errors, for the disclosed two-terminal memory, these multiple bits can store information that is included in the same logical page of memory, which can be advantageous. However, performing error-code correction (ECC) operations on multiple bits of data from the same MLC can result in additional stress on an ECC engine because if a MLC fails, all bits of that cell are likely to be bad. Splitting the multiple bits of a MLC in connection with encoding or decoding can average the errors from bad cells across multiple ECC codewords, thereby providing better coverage with the same ECC or reducing the overhead associated with ECC coverage.

24 Claims, 16 Drawing Sheets

SEPARATING BITS REPRESENTED BY A MLC IN CONNECTION WITH ECC

TECHNICAL FIELD

This disclosure generally relates to techniques associated with error-correcting code (ECC) in connection with multi-level cell (MLC) memory, and more specifically to separating the multiple bits represented by an MLC into different portions or codewords processed by an ECC.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides splitting bits represented by a multi-level cell (MLC) before and/or after an error-correcting code (ECC) operation in order to minimize affects of cell failure on the ECC. Systems and methods disclosed herein relate to a memory device. The memory device can comprise a controller, an ECC component, and a splitter component.

The controller can interface to a host device and to MLC memory characterized by different measurable states of a MLC representing multiple bits of data. The ECC component can detect and correct bit errors associated with the multiple bits of data according to an ECC. The splitter component can generate split data characterized by assigning a first bit of the multiple bits data to a first codeword of the ECC and a second bit of the multiple bits of data to a second codeword of the ECC.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
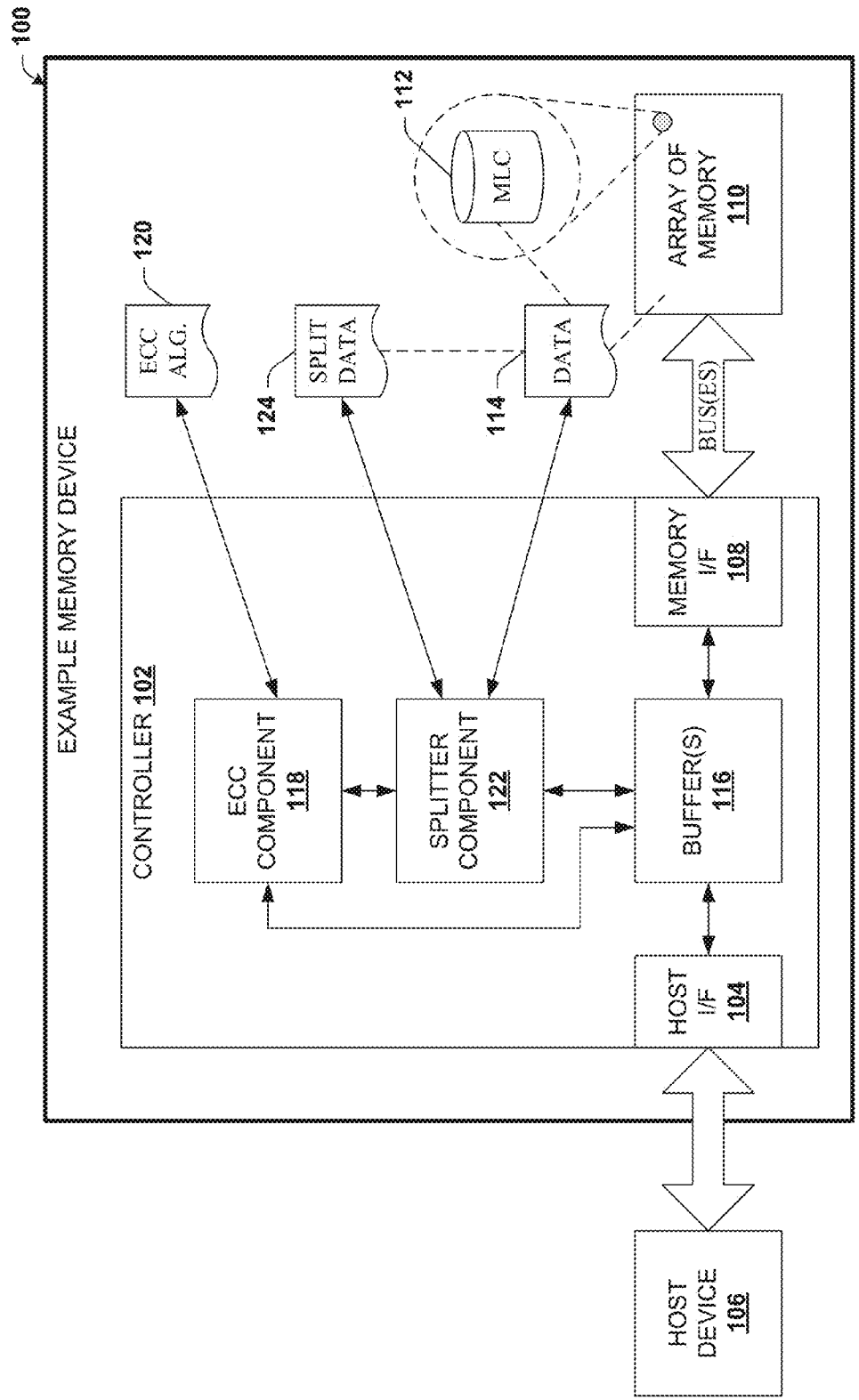
FIG. 1 illustrates a block diagram of an example memory device that can provide for splitting bits represented by a multi-level cell (MLC) before and/or after an error-correcting code (ECC) operation in order to minimize affects of cell failure on the ECC in accordance with certain embodiments of this disclosure.

Embodiments of this disclosure relate to mechanisms or techniques for splitting bits of data represented by a multi-level cell (MLC) into different codewords (or different portions) associated with an error-correcting code (ECC). Such techniques can be applied to two-terminal memory and/or resistive-switching memory or other (volatile or nonvolatile) memory with the capability of achieving an MLC implementation and addressing all data of a single MLC with a single page operation. A well-known counter-example is NAND flash memory, in which the multiple bits of a NAND flash MLC are not addressed to the same page of memory due to the potential for disturb errors. In contrast, the two-terminal memory disclosed herein is not subject to the same disadvantages of NAND flash memory in terms of potential disturb errors. As a result, the two-terminal memory disclosed herein can access more than one bit of an MLC with a single page operation. Said differently, multiple bits of data stored to a single MLC can be accessed with a single page operation. The inventor(s) believe that such represents an advantage over NAND flash memory and other types of memory.

With the advantage of accessing multiple bits of an MLC with a single page operation, certain challenges are presented that are not contemplated by other types of memory. One such challenge exists in the context of error-correcting code (ECC) in which, at the cost of reduced storage capacity and additional processing, errors associated with data stored by a memory array can be detected and/or corrected. Such errors can occur for a variety of reasons, but is commonly due to a bad cell within the memory. In the context of an MLC memory array, when a given cell fails, such may affect multiple bits of data, not just a single bit of data. If these multiple bits belong to one codeword for the ECC, then one MLC error can necessitate multiple bit corrections of the ECC codewords. In order to obviate this difficulty, various bits of an MLC cell can be split into different codewords that can be processed in series by a single encoder/decoder or in parallel by multiple encoders/decoders of the ECC elements.

Advantageously, one result is that an associated ECC engine can be implemented with reduced correction capability, which can reduce power consumption, circuitry, or other overhead. Additionally or alternatively, a given ECC engine can provide improved coverage, e.g., by being able to handle more errors than otherwise, which can extend the life of the device by allowing more cells to fail before the memory is unusable. By way of example, consider an MLC memory array capable of representing three bits per cell. Further suppose that eight cells are expected (or do) fail for a given program/erase (P/E) cycle. If all bits of these cells belong to the same codeword of the ECC engine, then the ECC engine will require 24-bit correction capability. However, by splitting the bits of the failed cells into three different codewords, then an ECC engine with 8-bit (as opposed to 24-bit) correction can fully correct the errors. Additionally or alternatively, an ECC engine with 24-bit correction capability now provides three times the required correction capability, which can increase the P/E cycles, retention, and overall reliability of a system employing the disclosed two-terminal memory.

Examples of the two-terminal memory technology include resistive memory (e.g., resistive-switching memory cell), ferromagnetic memory, phase change memory, magneto-resistive memory, organic memory, conductive bridging memory, and so on. Embodiments of the subject disclosure can provide a filamentary-based memory cell. One example of a filamentary-based memory cell can comprise: a conductive layer such as TiN, TaN or a conductive silicon (Si) bearing layer (e.g., polysilicon, polycrystalline, SiGe, etc.), a resistive switching layer (RSL) having defect regions and an active metal particle-containing layer for providing filament forming particles to the defect regions of RSL. The p-type or n-type Si bearing layer can include a p-type or n-type polysilicon, p-type or n-type polycrystalline SiGe, or the like. The RSL (which can also be referred to in the art as a resistive switching media (RSM)) can comprise, e.g., an undoped amorphous Si layer, a semiconductor layer having intrinsic characteristics, a Si sub-oxide, and so forth. In various embodiments, the RSM includes a number of crystalline defects or defect regions. Examples of the active metal layer can include, among others metals, mixtures, and alloys of: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. In various embodiments, particles of the active metal layer diffuse within and become trapped within the defect regions of the RSM. These trapped particles are neutral metal particles that form conductive filaments within the RSM. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In some aspects, the two-terminal memory can comprise 20 nanometer (nm) technology, whereas in other aspects the two-terminal memory can comprise sub-20 nanometer technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on. In the case of multi-level cells (MLC), two stacked layers of cells that can represent two bits of data per cell can have an effective component area of 1.07 $F^2$, and better component area metrics can be achieved by either increasing the number of stacks or the number of bits represented by the cells.

In additional embodiments disclosed herein, there is provided a digital storage device comprising two-terminal memory. In some embodiments, such a digital storage device can be removably connected to a computing device (e.g., a host device). In other embodiments, the digital storage device can be integrated with the computing device (e.g., read only memory, random access memory, etc.). In particular, embodiments, the digital storage device can be a memory stick that can be connected to a host computer over a memory interface (e.g., a host interface such as a universal serial bus (USB), or other suitable interface) and can store and retrieve information, and erase stored information, in response to commands by the host device.

Example Memory Devices for Separating Bits Represented by an MLC

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example memory device 100 is depicted. Memory device 100 can be a removable storage device, which can be connected to or disconnected from a computing device (e.g., a computer, a laptop, a terminal, a smart phone, a table computer, etc.) by way of a communication interface (e.g., a universal serial bus (USB) interface, or another memory bus or interface). In some embodiments, memory device 100 can be deployed on a hardware card for connecting with a server device or other computing device. In still other embodiments, memory device 100 can be a stand-alone device configured to communicate with a remote host device via a suitable remote communication platform (e.g., a wireless interface, a cellular interface, a satellite interface, a wired interface, an Ethernet interface, a broadband over power line interface, memory modules such as DIMMs communicating over buses or interfaces such as DDR3 or DDR4, etc., or the like, or a suitable combination thereof).

Memory device 100 can comprise a controller 102. Controller 102 can be configured to interface to a host device 106 over a host interface 104. Host interface 104 can operate to receive (e.g., high-level) host commands from the host computing device related to array of memory 110 on memory device 100. Suitable host commands can include a write command, a read command, an erase command, an overwrite command, or the like, or suitable combinations thereof. Additionally, host interface 104 can be configured to receive data from the host device 106 related to a host command, or provide data stored at array of memory 110 to the host device 106 in response to a host command. Controller 102 can further comprise a memory interface 108 configured to communicate with and execute memory operations (e.g., via low-level commands) in conjunction with array of memory 110 over one or more memory channels/ data buses. These data buses can be 8-bit channels, 16-bit channels, or another suitable configuration. In some embodiments, memory controller 102 can perform low-level memory operations with array of memory 110, including write, erase, read, etc. in accord with the high-level host commands.

The array of memory 110 can be a multi-level cell (MLC) array of memory. For example, array of memory 110 can comprise MLC 112 characterized by different measurable states of the MLC representing multiple bits of data 114, one example of which is provided in connection with FIG. 2A. In some embodiments, MLC 112 can be a resistive two-terminal memory cell. As used herein, data 114 is intended to relate to information to be read from MLC 112 (e.g., in response to a host device 106 read command), programmed to MLC 112 (e.g., in response to a host device 106 write command), or otherwise associated with MLC 112. It is understood that a command from host device 106 can be associated with a much larger amount of data (e.g., a page of memory) than is associated with MLC 112 (e.g., two bits, three bits, four bits, etc.). In such cases, data 114 will generally be a subset of the (page) data (e.g., data 304) associated with the host device 106 command, which is further detailed in connection with FIG. 3.

Memory controller 102 can further comprise a central processing unit (not shown), one or more buffers 116, an error correcting code (ECC) component 118, splitter component 122, as well as other suitable circuitry, modules, or components. The CPU can be configured to execute instructions associated with memory device 100. Buffers 116 can be a set of registers or other storage elements employed for temporarily storing data. For example, if host device 106 requests data from array of memory 110, the requested data can be stored to buffers 116 and updated (e.g., in response to an error being determined to exist) prior to being provided to host device 106. Optionally, data transmitted by host device 106 (e.g., as part of a write instruction) can be temporarily stored to buffers 116 prior to being programmed to array of memory 110.

ECC component 118 can be configured to detect and/or correct errors in data 114 according to a suitable ECC algorithm 120. By way of example, such detection/correction and/or algorithm 120 can be based on various ECC algorithms such as, e.g., a Hamming code, a Bose-Chaudhuri-Hocquenghem (BCH) code, a Reed-Solomon (RS) code, a low-density parity check (LDPC) code, or the like.

Splitter component 122 can be configured to generate split data 124. Split data 124 can be characterized by assigning a first bit of data 114 to a first codeword of ECC algorithm 120 and a second bit of data 114 to a second codeword of ECC algorithm 120. As noted previously, since the first bit and the second bit are both associated with a single cell (e.g., MLC 112), a failure of that cell can produce multiple bit errors. Accordingly, by splitting the first bit and the second bit (and potentially other bits) in a same cell into separate codewords, codeword errors can be statistically averaged among codewords, resulting in improved ECC function and/or capabilities. In some embodiments, logic associated with splitter component 122 can be included in controller 102. In some embodiments, logic associated with the splitter component 122 can be included in complementary metal oxide silicon (CMOS) circuitry. Additional detail relating to splitter component 122 can be found in connection with FIG. 2B.

Figure 2A:
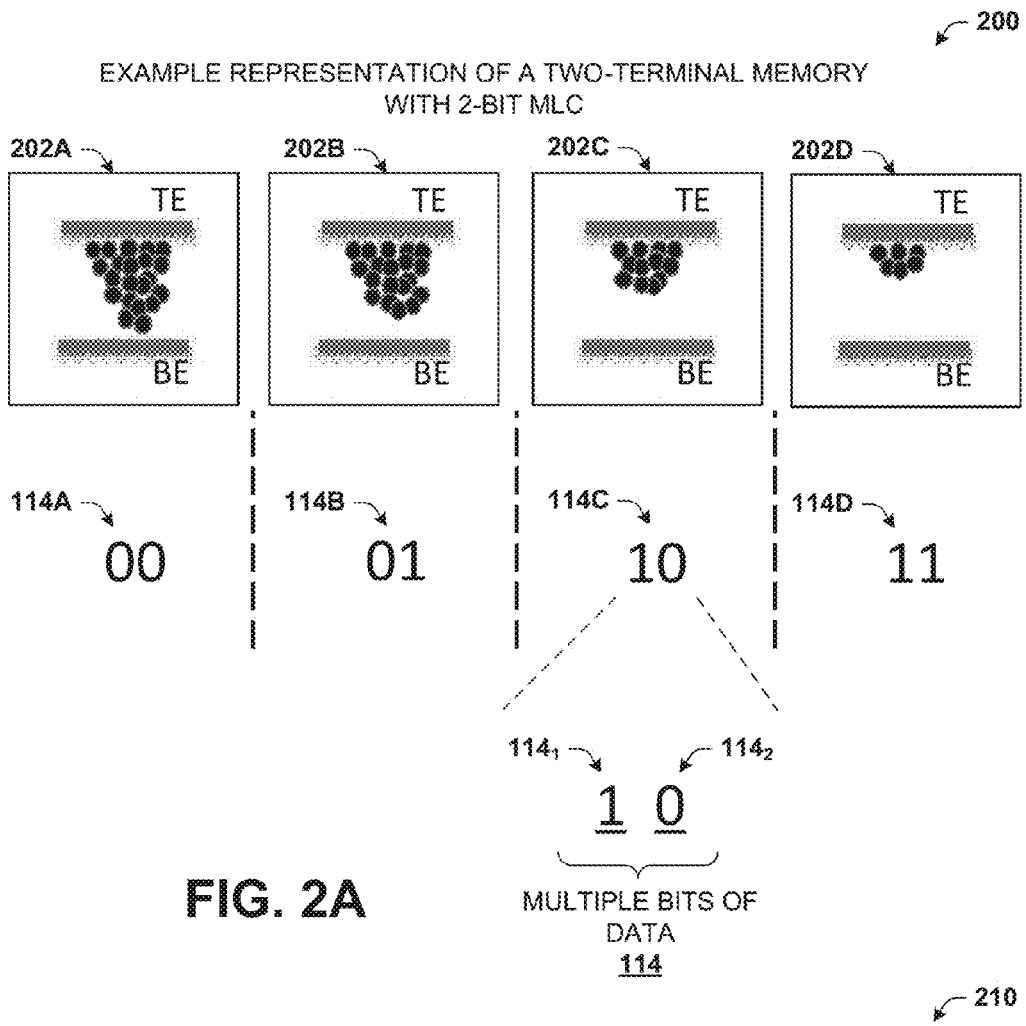
FIG. 2A depicts an example MLC in the context of a two-terminal memory in accordance with certain embodiments of this disclosure.

While still referring to FIG. 1, but turning as well to FIG. 2A, representation 200 is provided. Representation 200 illustrates an example MLC in the context of a two-terminal memory, in this case 2-bit MLC. It is understood that while 2-bit MLC is depicted in this example, MLC is capable of supporting substantially any number of bits, but will typically be in a range of two to about ten. Physically, the number of bits that can be represented by an MLC is generally limited by the number of distinct states of the MLC that can be sensed within a given sensing margin. For binary information representation, the number of distinct states, s, that can be sensed is equal to two raised to the power of the number of bits, b, that can be represented by the MLC. In other words, $s=2^b$. For example, for an MLC to represent two bits of information, four distinct states must be capable of being distinguished via sensing. For an MLC to represent three bits of information, eight distinct states must be capable of being distinguished via sensing, and so on.

As described herein, two-terminal memory (e.g., MLC 112) can include a top electrode (TE) and a bottom electrode (BE), with a switching material in between. Various stable states of the two terminal memory can be produced in response to application of an external electrical characteristic (e.g., changing voltages associated with TE or BE). In response, material from TE can extend into the switching material based on, e.g., the magnitude of the external electrical characteristic. Representation 200 depicts four distinct states, 202A-202D that can be distinguished electrically by sensing. For instance, two-terminal memory in state 202A can have a lower resistance (or a higher conductivity, etc) than state 202D. As such, each of the distinguishable states 202A-202D can be mapped to particular bit-data values 114A-114D.

Utilizing the third state 202C as an example, this state 202C is mapped to bit values "1" and "0", which represent the multiple bits of data 114. The first bit $114_1$ of multiple bits of data 114 is a "1" and the second bit $114_2$ of multiple bits of data 114 is a "0". If the MLC depicted fails, then all bits (in this case two bits are illustrated) in that cell can give bad data. By splitting the multiple bits of data 114 into different codewords, the disclosed ECC and other advantages can be achieved.

Figure 2B:
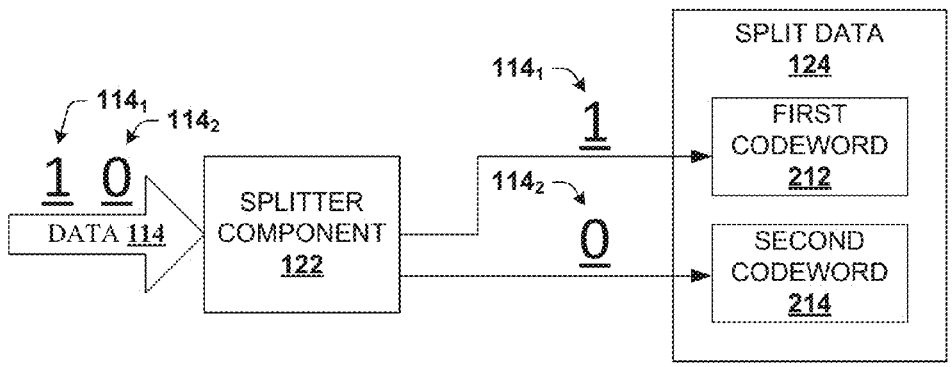
FIG. 2B depicts a block diagram describes illustrating a splitter component generating split data by splitting the data into different data portions in accordance with certain embodiments of this disclosure.

With regard to FIG. 2B, block diagram 210 describes splitter component 122 in more detail by providing an example illustration of generating split data 124 by splitting data 114 into different data portions. Splitter component 122 can receive data 114, which in this example is carried over from FIG. 2A in which the associated MLC 112 is in state 202C. Hence, potentially along with other data, splitter component 122 receives data 114 that represent bits to be written to or read from MLC 112. Splitter component 122 generates split data 124 by separating first bit $114_1$ into first codeword 212 and second bit $114_2$ into second codeword 214. In some embodiments, splitter component 122 can spit data 114 into a defined number of codewords (in this example, two) that equals another defined or determined number of bits represented by the different measurable states of MLC 112. For example, if MLC 112 supports representation of three bits of data, then splitter component 122 can split data 114 into three different codewords. If MLC 112 supports representation of four bits of data, then splitter component 122 can split data 114 into four different codewords, and so on. In some embodiment, the splitter may split three bits of data in a MLC 112 into two codewords or four bits of data in a MLC 112 into two or three codewords though this will not typically provide the full advantage of some other embodiments.

Figure 3:
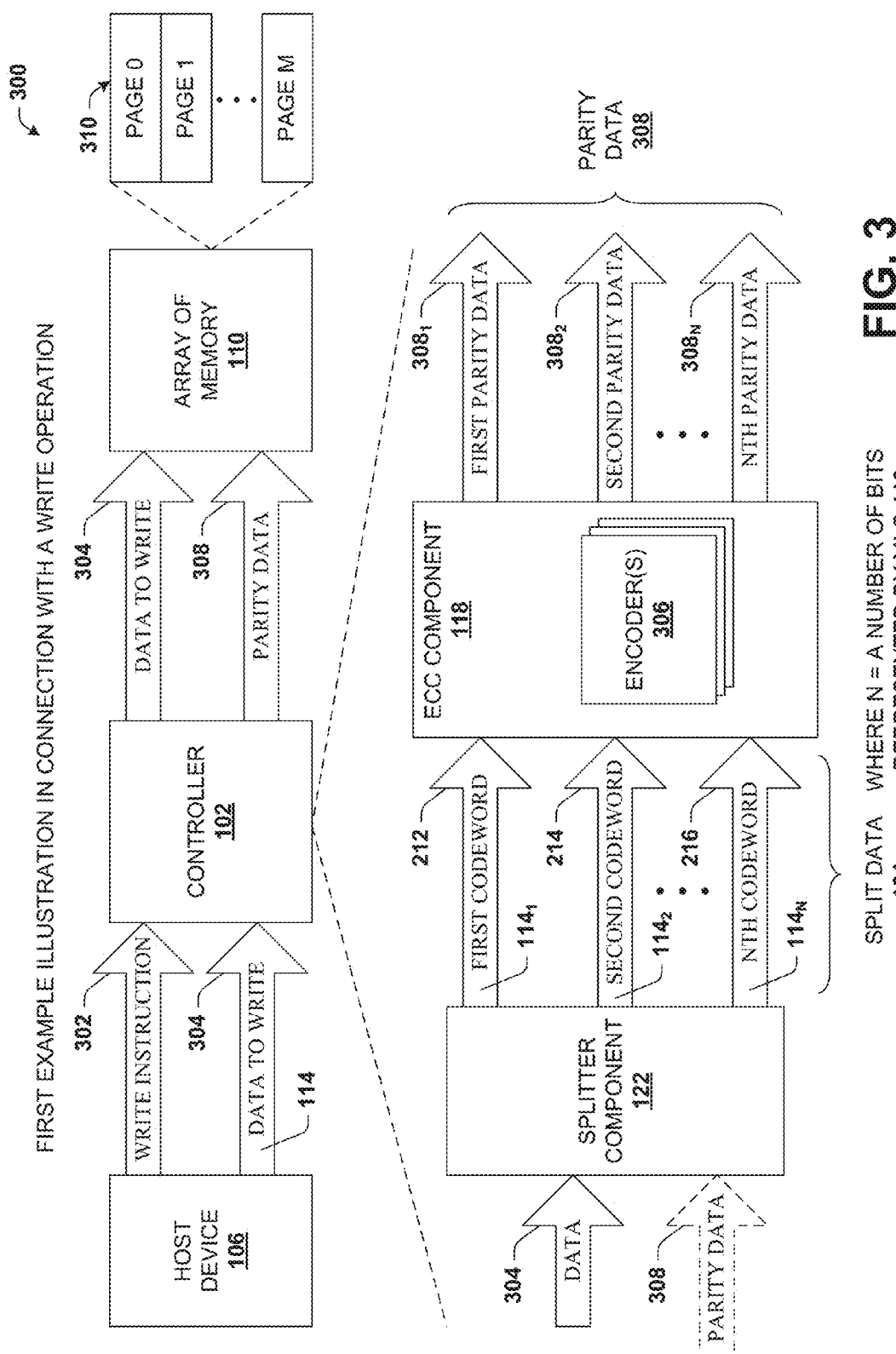
FIG. 3 illustrates a block diagram of an example system that can provide for a first example illustration in connection with a write operation in accordance with certain embodiments of this disclosure.

With reference now to FIG. 3, system 300 is depicted. System 300 provides for a first example illustration in connection with a write operation. For example, in some embodiments, splitter component 122 can split data 114 in response to a memory operation received by controller 102. For instance, host device 106 can issue a write instruction 302 instructing controller 102 to write information to array of memory 110. Host device 106 can also transmit that information, which is denoted as data 304 to write. Generally, the size of data 304 will be one or more pages of memory, but a portion of data 304 can be data 114, which is the information to be written to the MLC 112. In some embodiments, the size of the one or more pages is generally a plurality of codewords, wherein the number of codewords is a multiple of the number of bits in the MLC 112. In the event that the size of data 304 is not multiple of the number of bits in MLC 112, the controller 102 can take additional steps as further detailed herein. Regardless of the arrangement, data 304 can be written to one or more pages 310 of memory and MLC 112 is within the range of cells that are to store data 304. Data 304 can be passed to splitter component 122, which can split data 304 and/or data 114 into various codewords 212-216. First codeword 212 can include first data bit $114_1$, second codeword 214 can include second data bit $114_2$, and Nth codeword 216 can include an Nth data bit $114_N$. N can be substantially any number equal or greater than two and can be equal to the number of bits represented by MLC, but will typically be between two and about five or ten.

Encoders 306 included in ECC component 118 can receive this split data 124 (e.g., codewords 212-216), and generate associated parity data 308. Parity data 308 can be generate for each codeword 212-216 received, labeled individually as parity data $308_1$-$308_N$. Parity data 308 can also be referred to herein as a syndrome. Controller device 102 can pass data 304 and parity data 308 to array of memory 110. In some embodiments, splitter component 122 can similarly split parity data 308 (also referred to as "comingling" parity data 308). For example, once split, a first bit of first parity data $308_1$ can be followed by a first bit of second parity data $308_2$, and so on. In such embodiments, parity data 308 is not written to array of memory 110 in the same arrangement as what is produced by ECC component 118. Such can advantageously extend the benefits described herein in connection with data 304 to parity data 308, given that cell failure may happen to cells that store parity data 308 as well as those cells (e.g., MLC 112) that store data 304.

Figure 4:
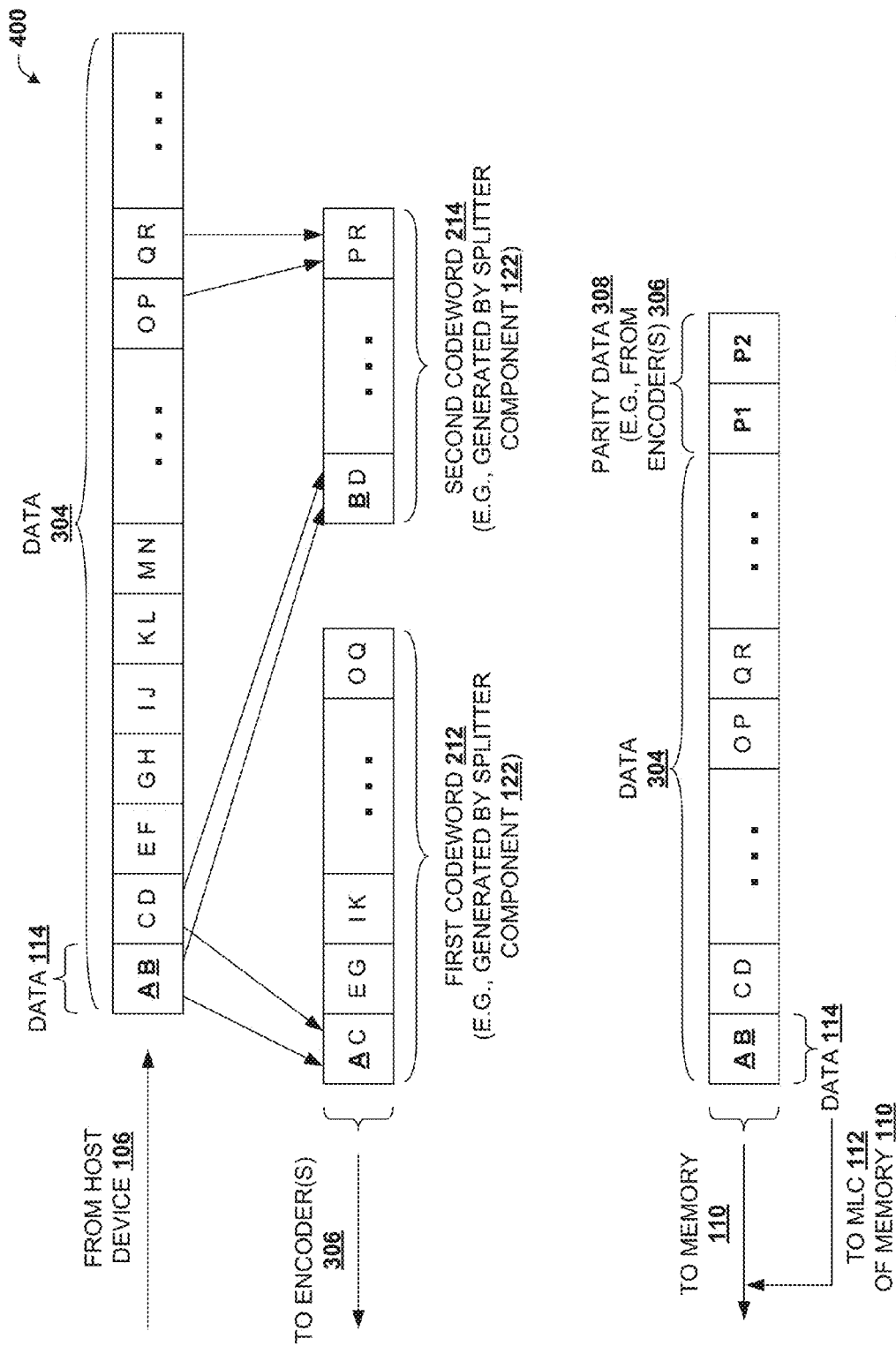
FIG. 4 depicts an example illustration providing a visual representation in connection with the first example write operation in accordance with certain embodiments of this disclosure.

Turning now to FIG. 4, illustration 400 is depicted. Illustration 400 provides a visual representation in connection with the first example write operation example described in connection with FIG. 3. Data 304, which includes data 114 containing the two bits to be written to MLC 112 (in this example a two-bit MLC), is received by controller 102. Splitter component 122 splits the first bit of data 114 (represented as "A") into a first codeword 212 and the second bit of data 114 (represented as "B") into a second codeword 214. As depicted, other bits included in data 304 can be split in a similar fashion. Codewords 212 and 214 can then be provided to encoder(s) 306, where parity data 308 is generated. Data 304 and parity data 308 can be provided to array of memory 110, with data 114 being programmed to MLC 112. It is appreciated that if MLC 112 fails or data 114 stored by MLC is corrupted, then both bits "A" and "B" are likely to be corrupted and incorrect. For this reason, parity data 308 has been generated in a manner in which bits "A" and "B" are in different codewords and therefore, a failure of some type to MLC 112 cannot cause more than one error per codeword, given that only one bit per cell will typically be included in a given codeword. It is further understood that even though parity data 308 is depicted here as being appended to the end of data 304, other arrangements are contemplated. For example, parity data 308 can be at the beginning of data 304, or elsewhere, and one portion of parity data 308 (e.g., "P1") can be at one location within data 304, while another portion (e.g., "P2") resides elsewhere. In some embodiments described above, parity data 308 can be comingled prior to being provided to array of memory 110. For example, once the parity data 308 is split by splitter component 122, a bit of parity data for a first codeword (e.g., 212) can be followed by a bit of parity data for a second codeword (e.g., 214) rather than by the second bit of the first codeword. Accordingly, individual memory cells of array of memory 110 do not store more than one bit of parity data 308 associated with any particular codeword 212-216.

Figure 5:
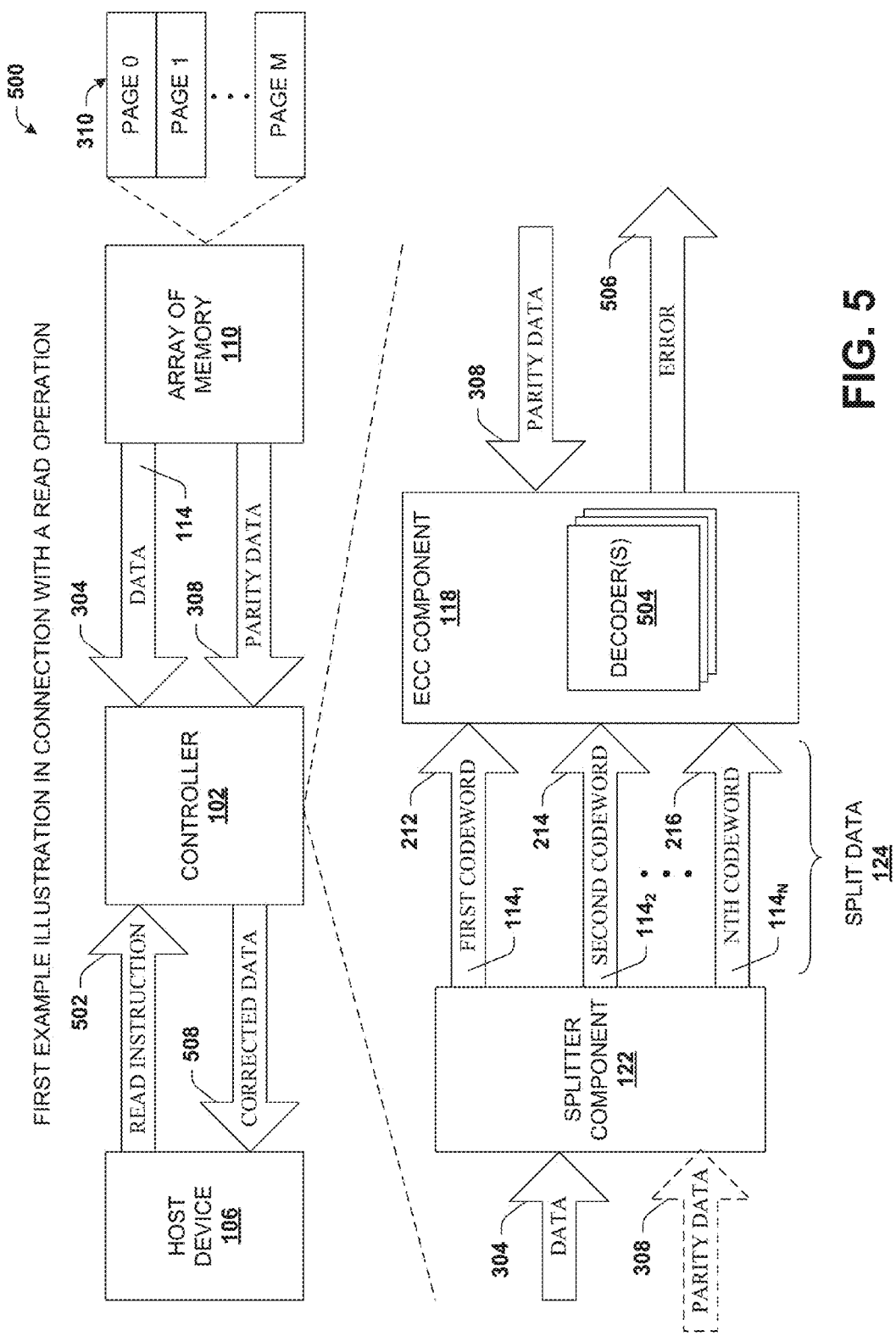
FIG. 5 illustrates a block diagram of an example system that can provide for a first example illustration in connection with a read operation in accordance with certain embodiments of this disclosure.

Referring now to FIG. 5, system 500 is depicted. System 500 provides for a first example illustration in connection with a read operation. System 500 can operate to read from memory data 304 that was written in a manner similar to that detailed in connection with system 300. For instance, host device 106 can issue a read instruction 502 instructing controller 102 to read information from array of memory 110, generally requesting one or more pages 310 of memory that is stored as data 304. Controller 102 can further request from array of memory 110 parity data 308 that was stored therein during the write operation detailed in connection with FIGS. 3 and 4. In some embodiments, data 304 and/or parity data 308 can be temporarily stored to buffer(s) 116 by controller 102.

Parity data 308 can be passed to ECC component 118. Data 304 can be passed to splitter component 122, which can split data 304 and/or data 114 into various codewords 212-216, collectively referred to as split data 124. First codeword 212 can include first data bit $114_1$, second codeword 214 can include second data bit $114_2$, and Nth codeword 216 can include an Nth data bit $114_N$. In some embodiments, N can be determined based on the number of bits MLC 112 can accommodate. In embodiments in which parity data 308 is comingled, then the comingled parity data 308 can be passed to splitter component 122 prior to being provided to ECC component 118.

ECC component 118 can include decoder(s) 504 configured to decode parity data 308 in connection with the split data 124 passed by splitter component 122. Decoders 504 can thereby determine whether an error(s) 506 exists in one or more of the codewords 212-216 of the split data 124. If an error(s) 506 is detected, ECC component 118 can attempt to correct error(s) 506. For example, data 304 stored in buffers 116 can be updated based on the error(s) 506 detected in split data 124. Such corrected data 508 can be provided to host device 106 in response to read instruction 502. It is understood that error(s) 506 can include an indication of the address within a particular codeword of the error bit. It is further understood that error(s) 506 can correct multiple errors within a given codeword.

Figure 6:
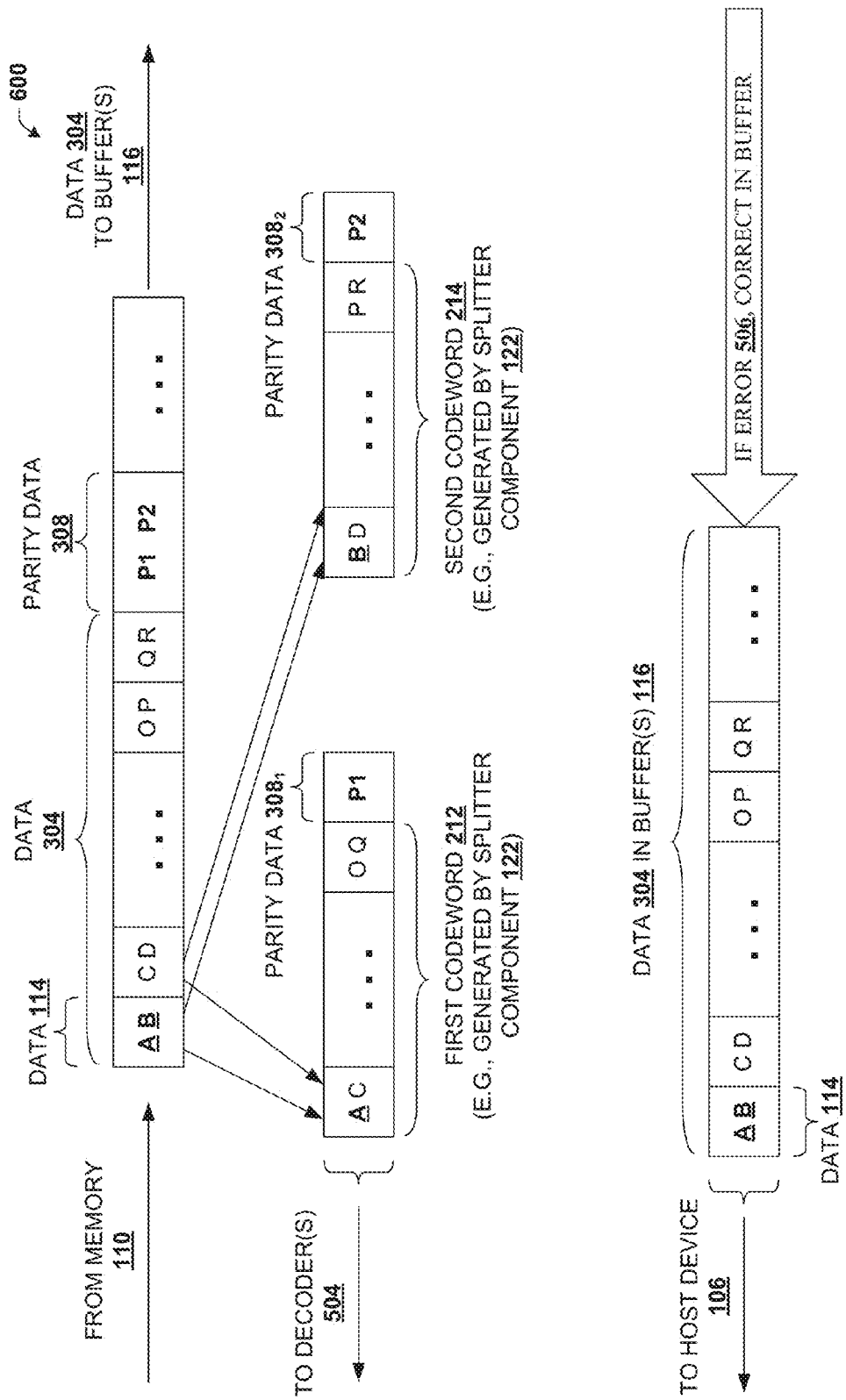
FIG. 6 depicts an example illustration providing a visual representation in connection with the first example read operation in accordance with certain embodiments of this disclosure.

Turning now to FIG. 6, illustration 600 is depicted. Illustration 600 provides a visual representation in connection with the first example read operation example described in connection with FIG. 5. Data 304, which includes data 114 containing the two bits ("A" and "B") read from MLC 112, and parity data 308 are received by controller 102 and optionally stored to buffers 116. Splitter component 122 splits the first bit of data 114 (e.g., "A") into first codeword 212 and the second bit of data 114 (e.g., "B") into second codeword 214. As depicted, other bits included in data 304 can be split in a similar fashion. Codewords 212 (along with an associated first portion of parity data $308_1$) and 214 (along with an associated second portion of parity data $308_2$) can then be provided to decoder(s) 504, where error(s) 506 can be detected and/or corrected. Corrected data 508 (or data 304 if no error(s) 506 was detected) can then be provided to host device 106.

Figure 7:
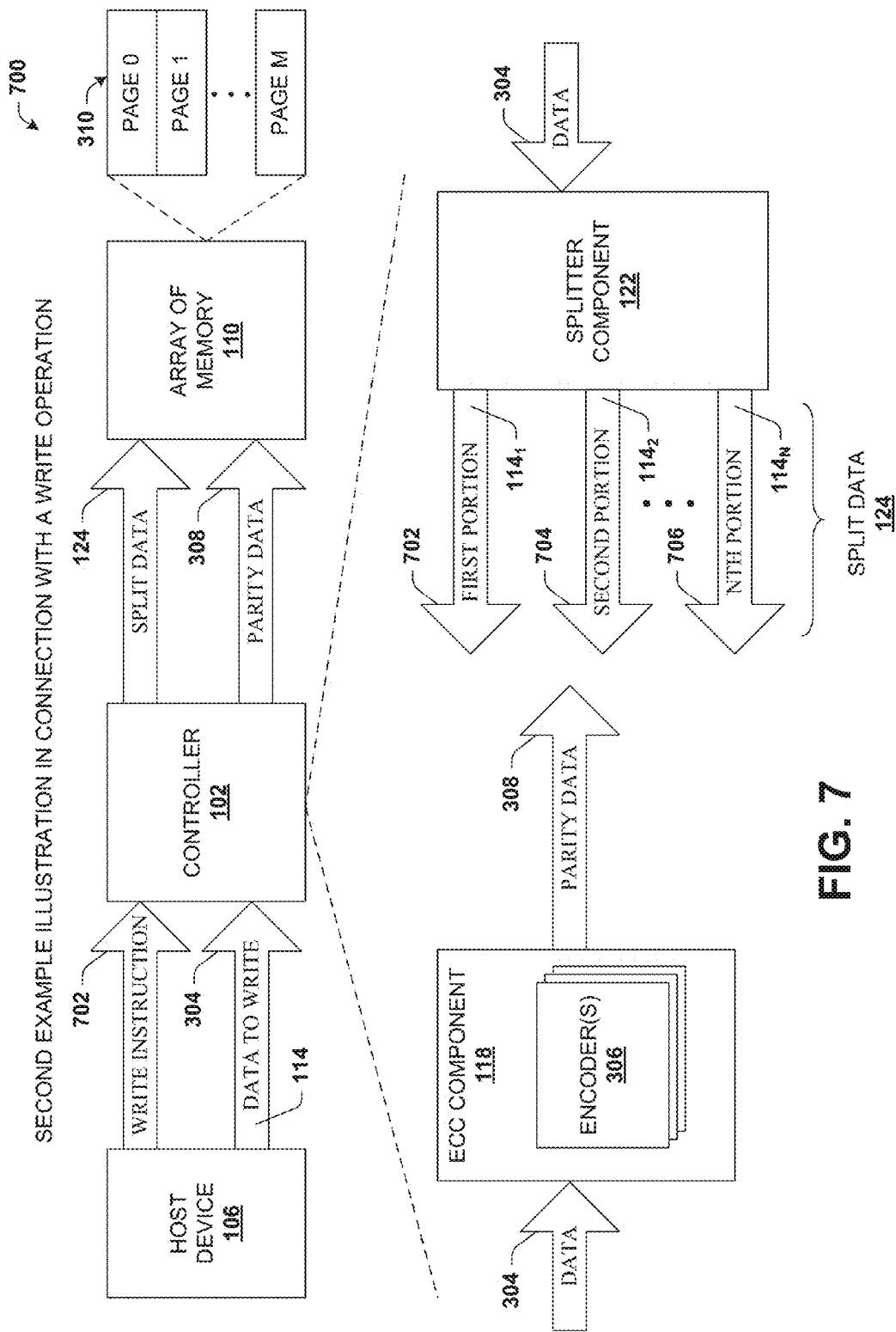
FIG. 7 illustrates a block diagram of an example system that can provide for a second example illustration in connection with a write operation in accordance with certain embodiments of this disclosure.

With reference now to FIG. 7, system 700 is depicted. System 700 provides for a second example illustration in connection with a write operation. This second example can represent an alternative to the first example illustration detailed in connection with FIG. 3. As before, controller device 102 can receive a write instruction (e.g., write instruction 702, which can be the same or different from write instruction 302) as well as the data 304 to write to array of memory 110.

Encoder(s) 306 of ECC component 18 can generate parity data 308 for each portion of data 304; each portion of data 304 being equal to a size of a codeword. Unlike in system 300, here, encoders 306 do not receive split data 124, but rather data 304. Data 304 can be divided into codeword-sized portions and parity data 308 are generated for each portion. Splitter component 122 can receive data 304 and generate split data 124 by splitting data 304 into the two or more portions 702-706. Both parity data 308 and split data 124 can be provided to array of memory 110. Again, unlike in system 300, where array of memory 110 stores data 304 and parity data 308 (that is generated from split data 124), here, array of memory 110 stores split data 124 and parity for each codeword of data 308 (that is generated from portions of data 304, not split data 124).

Figure 8:
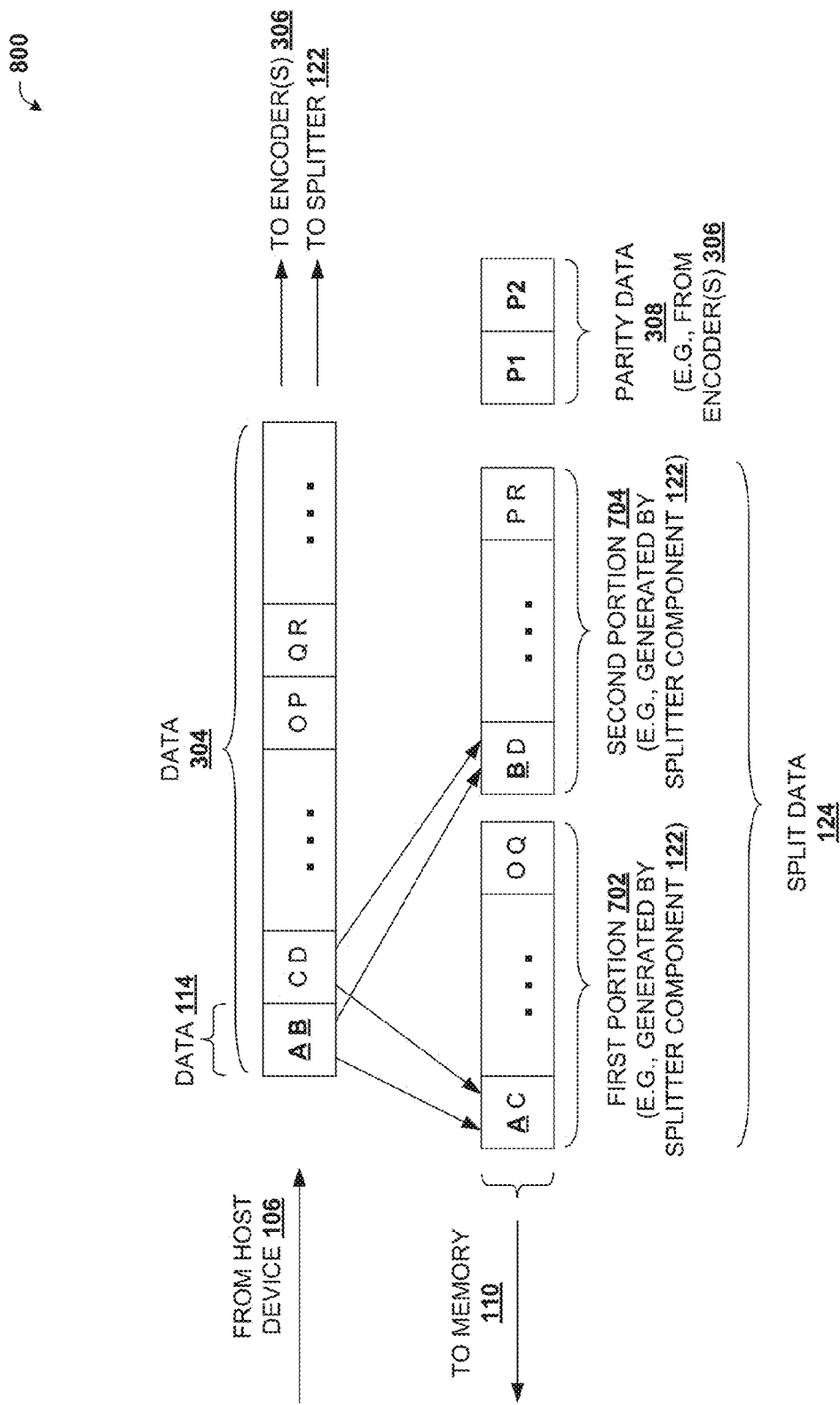
FIG. 8 depicts an example illustration providing a visual representation in connection with the second example write operation in accordance with certain embodiments of this disclosure.

Turning now to FIG. 8, illustration 800 is depicted. Illustration 800 provides a visual representation in connection with the second example write operation example described in connection with FIG. 7. Data 304, which includes data 114 containing the two bits to be written to array of memory 110, are received by controller 102. Splitter component 122 splits the first bit of data 114 (represented as "A") into first portion 702 and the second bit of data 114

(represented as "B") into second portion 704. As depicted, other bits included in data 304 can be split in a similar fashion. This split data 124 is stored to memory in the form of portions 702 and 704 rather than being passed to encoder(s) 306. Instead, encoders 306 can receive data 304 directly (rather than split data 124), and generate associated parity data 308 for each codeword-sized portion 702-706, which can also be written to array of memory 110. Although the second example (e.g., FIGS. 7 and 8) operates differently than the first example write operation (e.g., FIGS. 3 and 4) advantages associated with averaging errors between codewords can still be achieved, albeit in a different manner.

In some embodiments, splitter component 122 can similarly split parity data 308 (also referred to as "comingling" parity data 308). For example, once split, a first bit of first parity data $308_1$ can be followed by a first bit of second parity data $308_2$, and so on. In such embodiments, parity data 308 is not written to array of memory 110 in the same arrangement as what is produced by ECC component 118. Such can advantageously extend the benefits described herein in connection with data 304 to parity data 308, given that cell failure may happen to cells that store parity data 308 as well as those cells (e.g., MLC 112) that store data 304.

Figure 9:
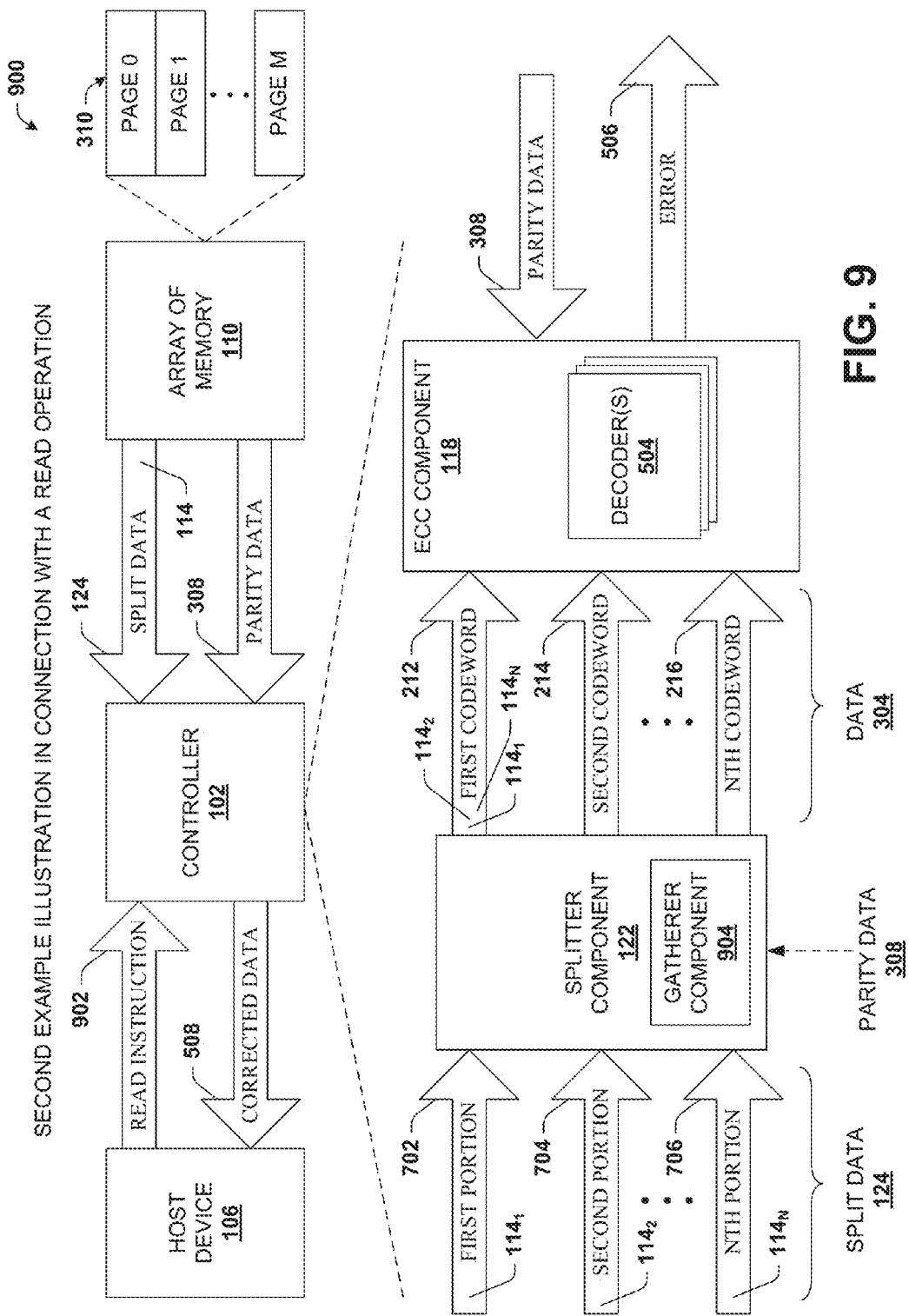
FIG. 9 illustrates a block diagram of an example system that can provide for a second example illustration in connection with a read operation in accordance with certain embodiments of this disclosure.

Referring to FIG. 9, system 900 is depicted. System 900 provides for a second example illustration in connection with a read operation. This second example can represent an alternative to the first example illustration detailed in connection with FIG. 5. As before, controller device 102 can receive a read instruction (e.g., read instruction 902, which can be the same or different from read instruction 502). In response controller 102 can receive a version of the requested information from array of memory 110 along with associated parity data 308. Recall, as split data 124 was written to memory 110 (rather than data 304), in this case, controller 102 receives split data 124, and provides split data 124 to splitter component 122.

Splitter component 122, which in some embodiments can include gatherer component 904, can receive split data 124. Gatherer component 904 can operate in a manner to reverse (or undo) the operation performed by the splitter component 122 and operates on split data 124 (e.g., to construct data 304), rather than operating on data 304 (e.g., to construct split data 124). For example, gatherer component 904 can generate data 304 by assigning a first bit of first portion 702 of split data 124 to a first bit of first codeword 212, a first bit of second portion 704 to second bit of first codeword 212, and so on. Such operates to reverse the data arrangement that created split data 124. Hence, a codeword (e.g., first codeword 212) can now include all data originally provided by the host with the exception of some bits that might have failed in the memory during or after the write command. These codewords (labeled here as data 304 as they represent the original arrangement of data 304 received in connection with write instruction 702) can be provided to ECC component 118 as well as to buffer(s) 116. Decoder(s) 504 associated with ECC component 118 can further receive parity data 308 in order to detect and/or correct error(s) 506 (e.g., at data stored to buffer(s) 116). Corrected data 508 can be provided to host device 106. In embodiments in which parity data 308 is comingled, then the comingled parity data 308 can be passed to splitter component 122 prior to being provided to ECC component 118.

Figure 10:
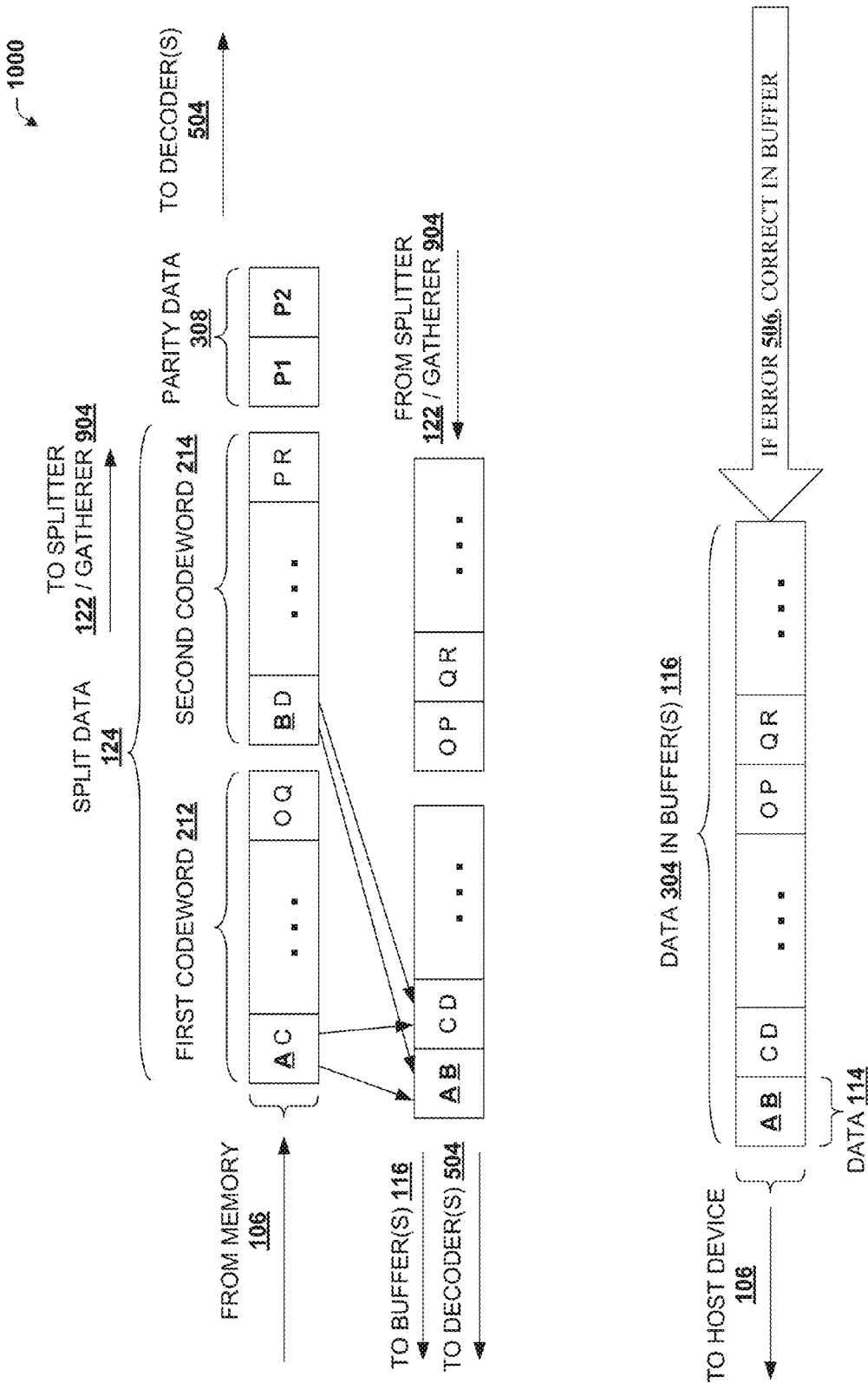
FIG. 10 depicts an example illustration providing a visual representation in connection with the second example read operation in accordance with certain embodiments of this disclosure.

Turning now to FIG. 10, illustration 1000 is depicted. Illustration 1000 provides a visual representation in connection with the second example read operation example described in connection with FIG. 9. Split data 124, which includes first codeword 212 and second codeword 214, as well as associated parity data 308 are received by controller 102. Split data 124 can be provided to splitter component 124 and/or gatherer component 904 and parity data 308 can be provided to decoder(s) 504 of ECC component 118 or to the splitter component 124 and/or gatherer component 904 if the parity data 308 was split prior to being stored in the array of memory 110. Splitter component 122 (and/or gatherer component 904) splits a first bit of split data 124 (represented as "A") into first codeword 212 and a second bit of split data 124 (represented as "B") into second codeword 214, which reconstructs data 304. This data 304 can then be provided to decoder(s) 504 as well as to buffer(s) 116. If error 506 is detected, data 304 can be updated accordingly, and corrected data 508 can be provided to host device 106.

In some cases, the various example write operations (e.g., detailed in connection with FIGS. 3, 4, 7, and 8) or various example read operations (e.g., detailed in connection with FIGS. 5, 6, 9, and 10) have been described in connection with a page write or page read operation. It is appreciated that the disclosed subject matter can also be used in connection with partial page write operations or a partial page read operation. For example, controller 102 can effectuate a partial page write by reading codewords affected by the partial page write operation, then merge both sets of data. Thereafter, one of the write embodiments detailed herein can be employed the write the merged data to array of memory 110. For a partial page read, controller 102 can, e.g., read codewords associated with the partial page read request, process the read data according to one of the read embodiments detailed herein, and send the portion of data requested by the host (e.g., the partial page).

Example Methods for Setting Memory Operational Characteristics

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 11-14. While for purposes of simplicity of explanation, the methods of FIGS. 11-14 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 11:
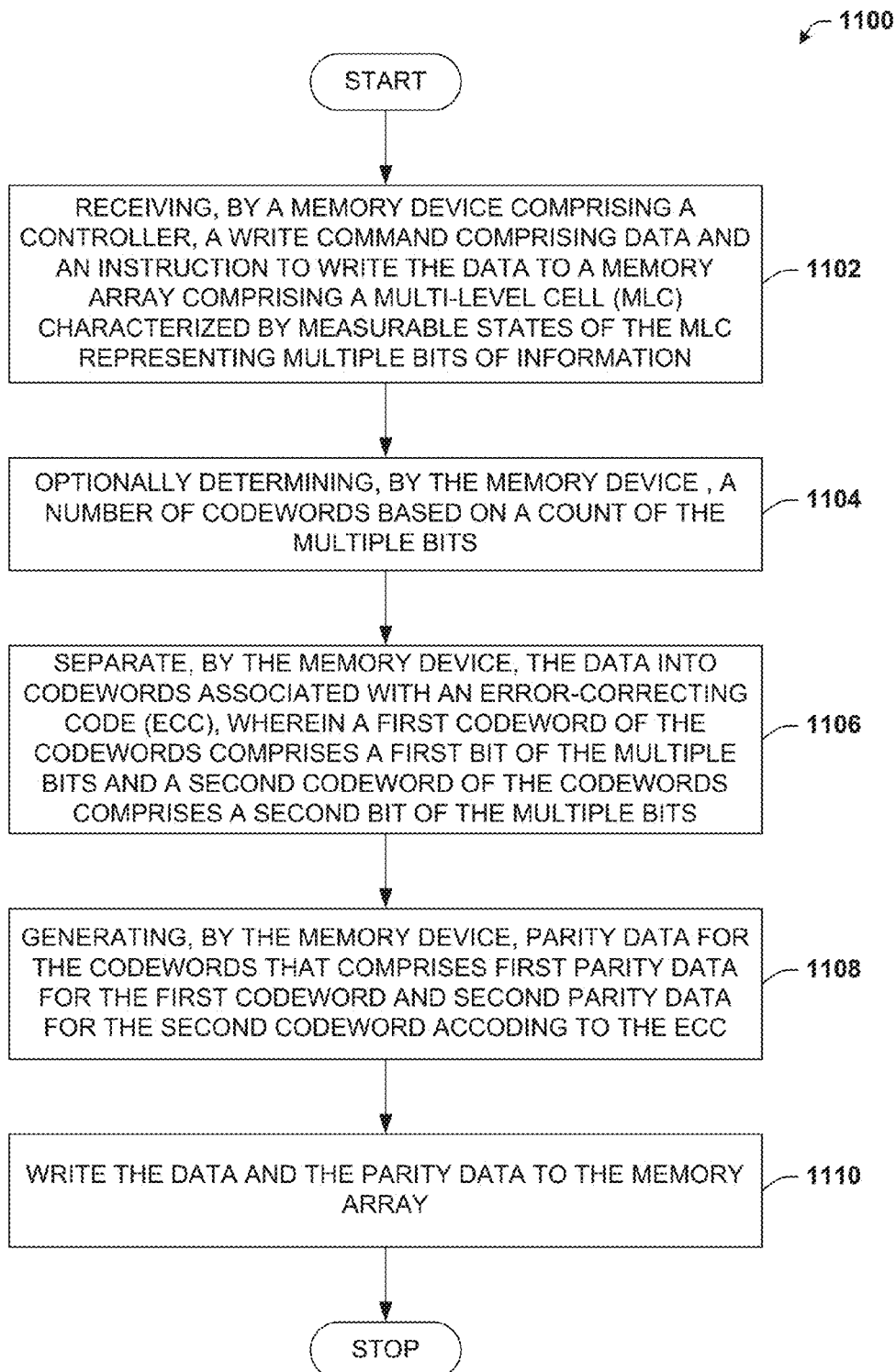
FIG. 11 illustrates an example methodology that can provide for separating bits of an MLC prior to ECC encoding of data written to memory in accordance with certain embodiments of this disclosure.

Referring now to FIG. 11, exemplary method 1100 is illustrated. Method 1100 can provide for separating bits of an MLC prior to ECC encoding of data written to memory. At reference numeral 1102, a memory device comprising a controller can receive a write command comprising data and an instruction to write the data to a memory array comprising a MLC. The MLC can be characterized by measurable states of the MLC representing multiple bits of information. For example, if the MLC can be set to four distinct states that can be distinguished by sensing techniques, then the MLC can logically store two bits of information. If the MLC can be set to 16 distinct states that can be distinguished by sensing techniques, then the MLC can logically store four bits of information.

At reference numeral 1104, the memory device can be configured to determine a number of codewords based on a count of the multiple bits. For example, if the MLC logically stores two bits of data, then the memory device can identify two as the number of codewords. If the MLC logically stores three bits of data, then the memory device can identify three as the number of codewords, and so on.

At reference numeral 1106, the memory device can separate the data (e.g., data received in connection with reference numeral 1102) into a number (e.g., determined at reference numeral 1104) of codewords associated with an ECC. A first codeword of the codewords can comprise a first bit of the multiple bits and a second codeword of the codewords can comprise a second bit of the multiple bits. Hence, the various bits of a given MLC can be divided into separate ECC codewords.

At reference numeral 1108, the memory device can generate parity data for the codewords. The parity data can comprise first parity data for the first codeword according to the ECC. The parity data can further comprise second parity data for the second codeword according to the ECC. At reference numeral 1110, the memory device can facilitate writing the data and the parity data to the memory array.

Figure 12:
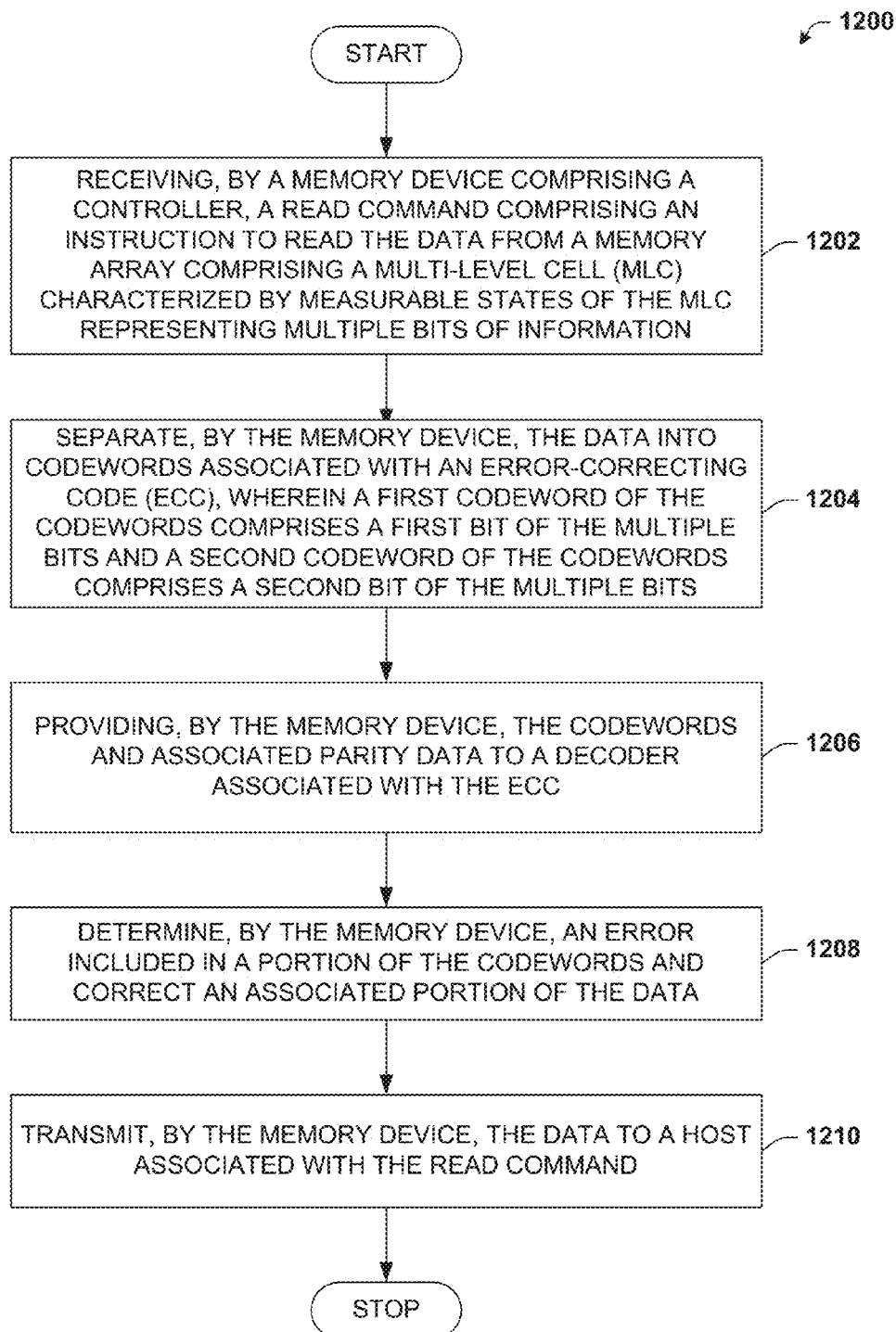
FIG. 12 illustrates an example methodology that can provide for separating bits of an MLC prior to ECC decoding of data read from memory in accordance with certain embodiments of this disclosure.

Turning now to FIG. 12, exemplary method 1200 is illustrated. Method 1200 can provide for separating bits of an MLC prior to ECC decoding of data read from memory. At reference numeral 1202, a memory device comprising a controller can receive a read command comprising an instruction to read the data from a memory array comprising a MLC. The MLC can be characterized by measurable states of the MLC representing multiple bits of information. In response, the controller can receive the data and associated parity data from the memory array.

At reference numeral 1204, the memory device can separate the data into codewords associated with an ECC. A first codeword of the codewords can comprise a first bit of the multiple bits and a second codeword of the codewords can comprise a second bit of the multiple bits. Hence, the various bits of a given MLC can be divided into separate ECC codewords. In some embodiments, the memory device can separate the multiple bits into a defined number of codewords that is based on or equal to a number of bits that can be represented by the MLC.

At reference numeral 1206, the memory device can provide the codewords and associated parity data to a decoder associated with the ECC. Based on these inputs, at reference numeral 1208, the decoder can determine an error included in a portion of the codewords and correct an associated portion of the data. At reference numeral 1210, the memory device can transmit the data and/or corrected data to a host device associated with the read command.

Figure 13:
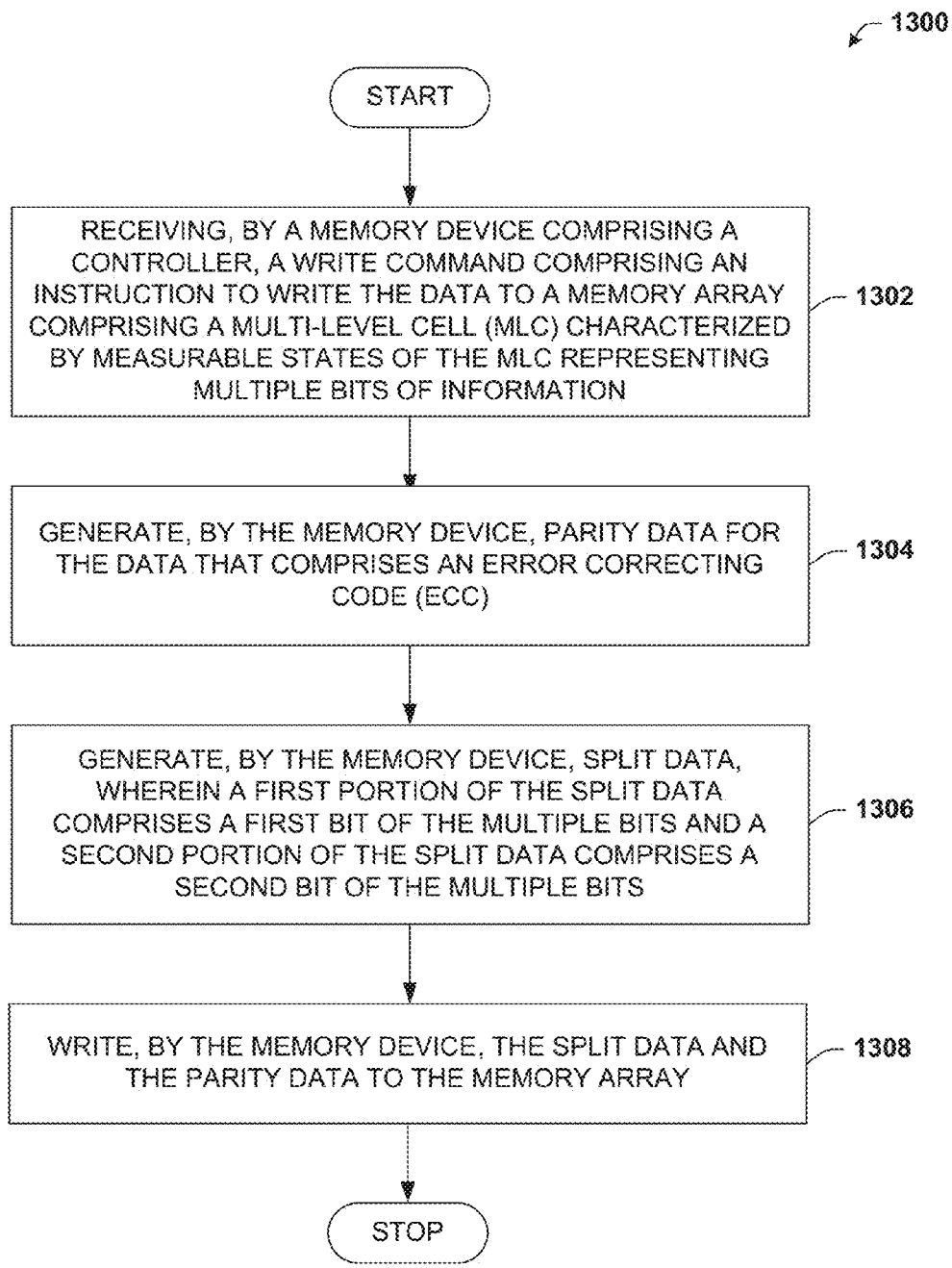
FIG. 13 illustrates an example methodology that can provide for generating parity data for data received in connection with a write instruction and splitting the data prior to writing to memory in accordance with certain embodiments of this disclosure.

Referring now to FIG. 13, exemplary method 1300 is illustrated. Method 1300 can provide for generating parity data for data received in connection with a write instruction and splitting the data prior to writing to memory. At reference numeral 1302, a memory device comprising a controller can receive a write command comprising data and an instruction to write the data to a memory array comprising a MLC. The MLC can be characterized by measurable states of the MLC representing multiple bits of information. For example, if the MLC can be set to four distinct states that can be distinguished by sensing techniques, then the MLC can logically store two bits of information. If the MLC can be set to 16 distinct states that can be distinguished by sensing techniques, then the MLC can logically store four bits of information.

At reference numeral 1304, the memory device can be configured to generate parity data for the data that comprises an ECC. At reference numeral 1306, the memory device can generate split data. Split data can be generated by separating as follows. A first portion of the split data can comprise a first bit of the multiple bits of data and a second portion of the split data can comprise a second bit of the multiple bits of data. Split data can be logically composed of a defined number of portions that is based on or equal to a number of bits in the multiple bits of data. For example, if the MLC logically stores two bits of data, then the memory device can split the data into two split data portions. If the MLC logically stores three bits of data, then the memory device can split the data into three split data portions, and so on.

At reference numeral 1308, the memory device can write the split data and the parity data to the memory array. It is understood that in this embodiment, the arrangement of the data received in connection with the write command is not maintained and/or the memory array stores a different arrangement for the bits of data. Said differently, split data rather than the data is stored to the memory array. However, upon a subsequent read instruction, this split data can be rearranged back into the arrangement provided in connection with the write operation as detailed with reference to FIG. 14.

Figure 14:
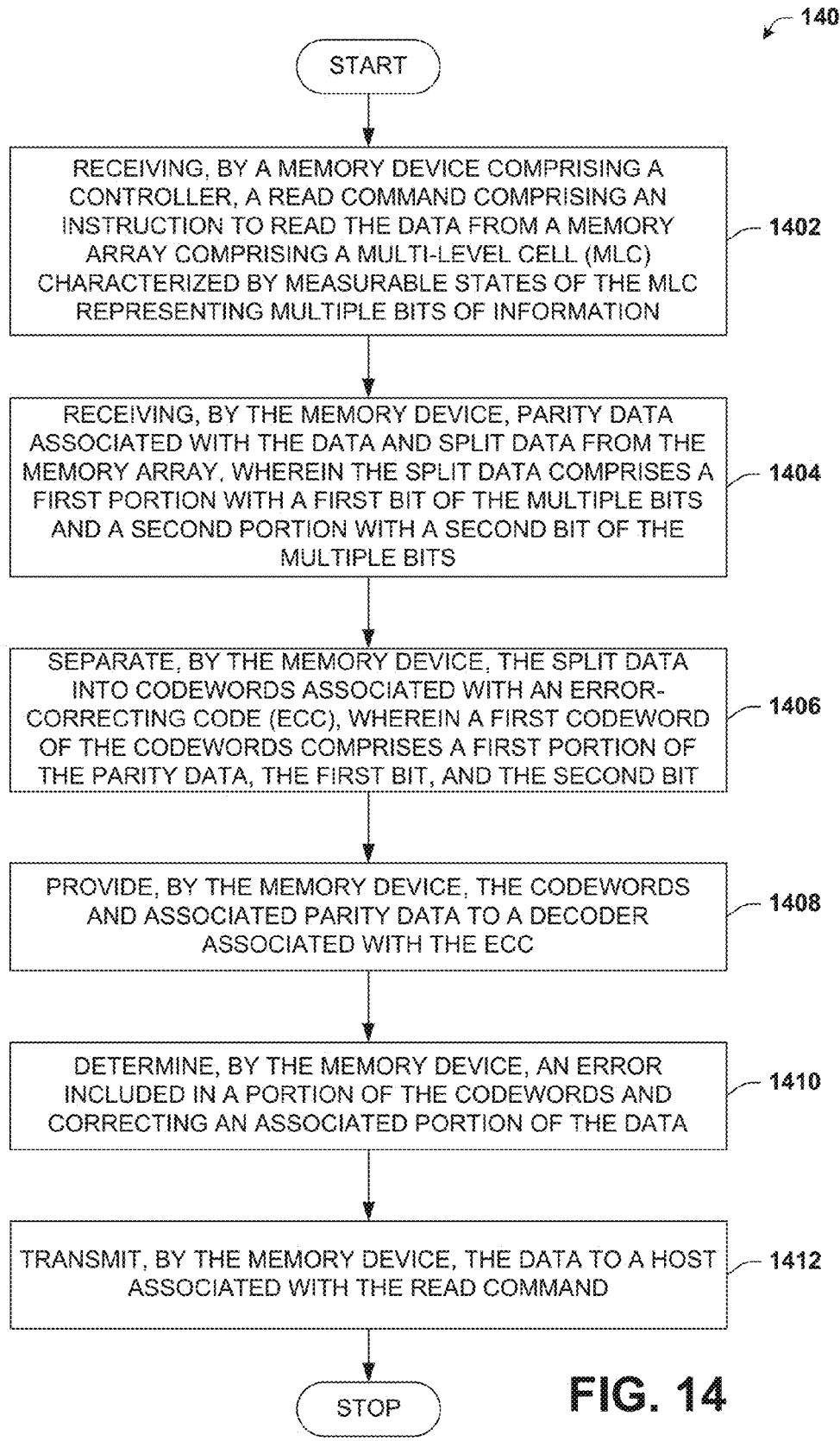
FIG. 14 illustrates an example methodology that can provide for separating bits of an MLC containing split data prior to ECC decoding of data read from memory in accordance with certain embodiments of this disclosure.

Turning now to FIG. 14, exemplary method 1400 is illustrated. Method 1400 can provide for separating bits of an MLC containing split data prior to ECC decoding of data read from memory. At reference numeral 1402, a memory device comprising a controller can receive a read command comprising an instruction to read the data from a memory array comprising a MLC. The MLC can be characterized by measurable states of the MLC representing multiple bits of information.

At reference numeral 1404, the memory device can receive parity data associated with the data and split data from the memory array. The split data can comprise a first portion with a first bit of the multiple bits of data and a second portion with a second bit of the multiple bits of data.

At reference numeral 1406, the memory device can separate the split data into codewords associated with an ECC. A first codeword of the codewords can comprise a first portion of the parity data, the first bit and the second bit that were previously separated into different codewords in connection with the generation of split data described in connection with reference numeral 1306.

At reference numeral 1408, the memory device can provide the codewords and associated parity data to a decoder associated with the ECC. Based on these inputs, at reference numeral 1410, the decoder can determine an error included in a portion of the codewords and correct an associated portion of the data. At reference numeral 1412, the memory device can transmit the data and/or corrected data to a host device associated with the read command.

Example Operating Environments

Figure 15:
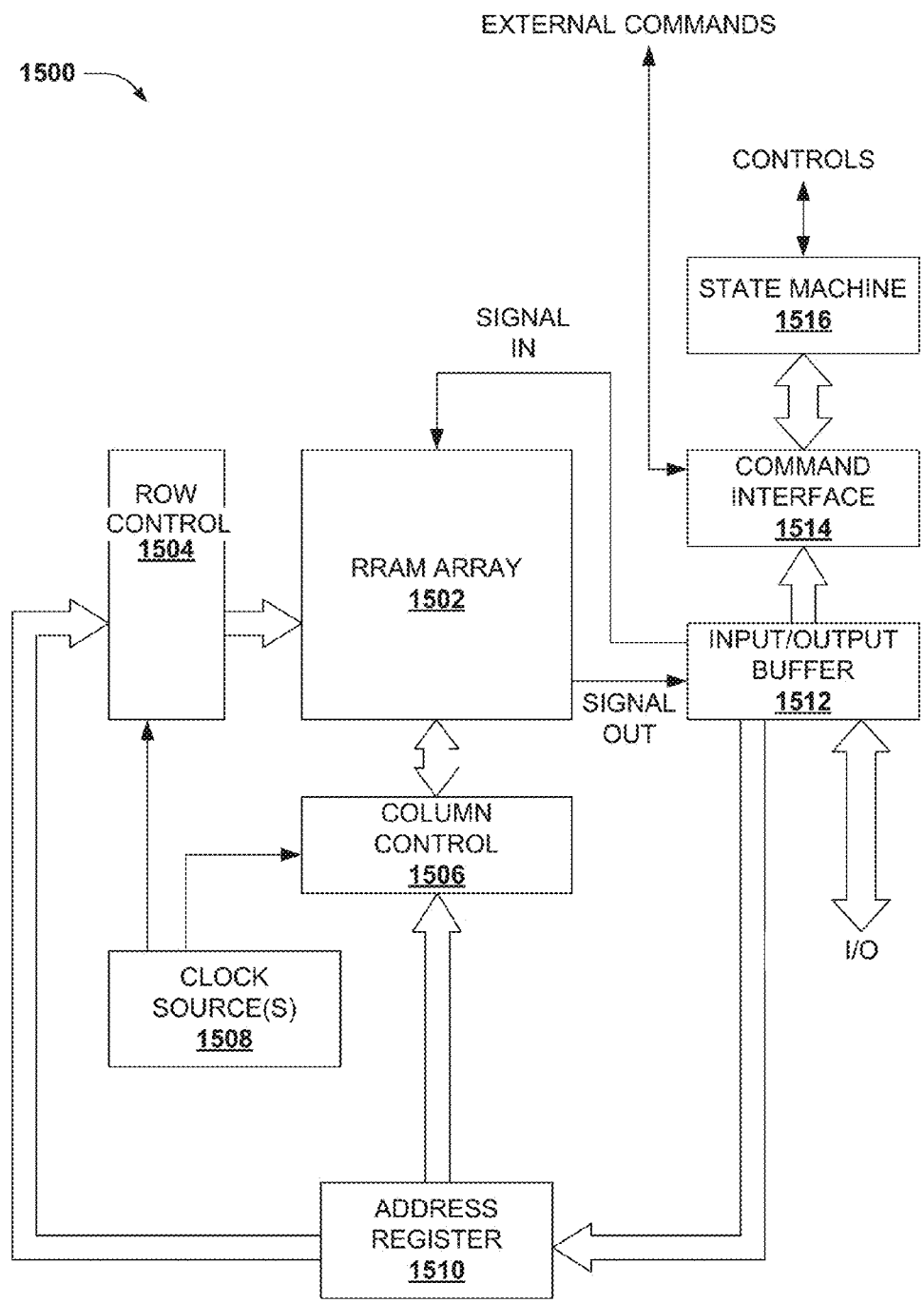
FIG. 15 illustrates a block diagram of an example electronic operating environment in accordance with certain embodiments of this disclosure.

In order to provide a context for the various aspects of the disclosed subject matter, FIG. 15, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 15 illustrates a block diagram of an example operating and control environment 1500 for a RRAM array 1502 according to aspects of the subject disclosure. In at least one aspect of the subject disclosure, RRAM array 1502 can comprise a variety of RRAM memory cell technology. Particularly, RRAM array can be configured or operated to mitigate or avoid sneak path currents of the RRAM array, as described herein.

A column controller 1506 can be formed adjacent to RRAM array 1502. Moreover, column controller 1506 can be electrically coupled with bit lines of RRAM array 1502. Column controller 1506 can control respective bitlines, applying suitable program, erase or read voltages to selected bitlines.

In addition, operating and control environment 1500 can comprise a row controller 1504. Row controller 1504 can be formed adjacent to column controller 1506, and electrically connected with word lines of RRAM array 1502. Row controller 1504 can select particular rows of memory cells with a suitable selection voltage. Moreover, row controller 1504 can facilitate program, erase or read operations by applying suitable voltages at selected word lines.

A clock source(s) 1508 can provide respective clock pulses to facilitate timing for read, write, and program operations of row control 1504 and column control 1506. Clock source(s) 1508 can further facilitate selection of word lines or bit lines in response to external or internal commands received by operating and control environment 1500. An input/output buffer 1512 can be connected to an external host apparatus, such as a computer or other processing device (not depicted) by way of an I/O buffer or other I/O communication interface. Input/output buffer 1512 can be configured to receive write data, receive an erase instruction, output readout data, and receive address data and command data, as well as address data for respective instructions. Address data can be transferred to row controller 1504 and column controller 1506 by an address register 1510. In addition, input data is transmitted to RRAM array 1502 via signal input lines, and output data is received from RRAM array 1502 via signal output lines. Input data can be received from the host apparatus, and output data can be delivered to the host apparatus via the I/O buffer.

Commands received from the host apparatus can be provided to a command interface 1514. Command interface 1514 can be configured to receive external control signals from the host apparatus, and determine whether data input to the input/output buffer 1512 is write data, a command, or an address. Input commands can be transferred to a state machine 1516.

State machine 1516 can be configured to manage programming and reprogramming of RRAM array 1502. State machine 1516 receives commands from the host apparatus via input/output interface 1512 and command interface 1514, and manages read, write, erase, data input, data output, and like functionality associated with RRAM array 1502. In some aspects, state machine 1516 can send and receive acknowledgments and negative acknowledgments regarding successful receipt or execution of various commands.

To implement read, write, erase, input, output, etc., functionality, state machine 1516 can control clock source(s) 1508. Control of clock source(s) 1508 can cause output pulses configured to facilitate row controller 1504 and column controller 1506 implementing the particular functionality. Output pulses can be transferred to selected bit lines by column controller 1506, for instance, or word lines by row controller 1504, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 16:
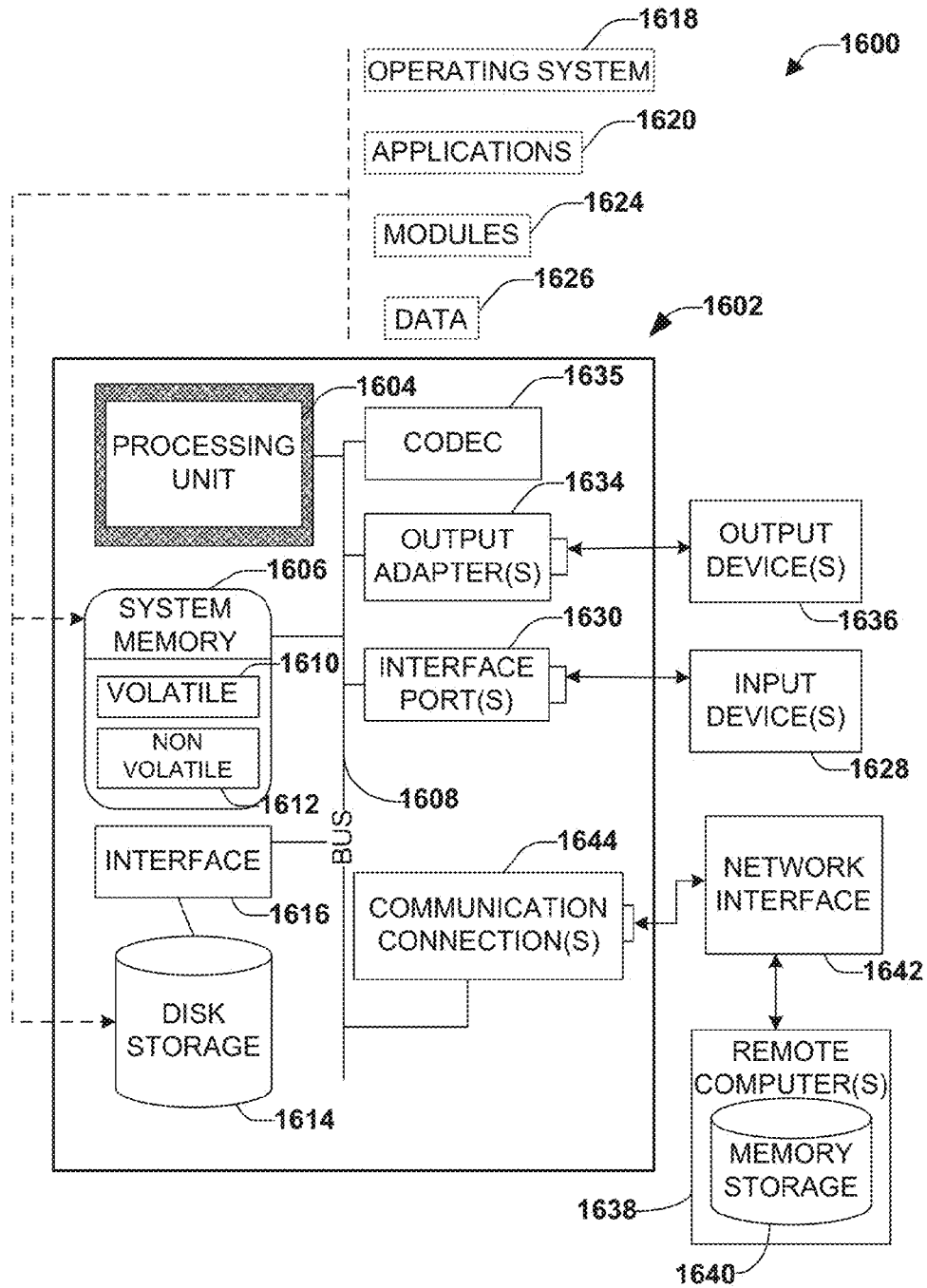
FIG. 16 illustrates a block diagram of an example computing environment in accordance with certain embodiments of this disclosure.

With reference to FIG. 16, a suitable environment 1600 for implementing various aspects of the claimed subject matter includes a computer 1602. The computer 1602 includes a processing unit 1604, a system memory 1606, a codec 1635, and a system bus 1608. The system bus 1608 couples system components including, but not limited to, the system memory 1606 to the processing unit 1604. The processing unit 1604 can be any of various available processors. Dual microprocessors and other multiprocessor architectures also can be employed as the processing unit 1604.

The system bus 1608 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1606 includes volatile memory 1610 and non-volatile memory 1612. The basic input/output system (BIOS), containing the basic routines to transfer information between elements within the computer 1602, such as during start-up, is stored in non-volatile memory 1612. In addition, according to present innovations, codec 1635 may include at least one of an encoder or decoder, wherein the at least one of an encoder or decoder may consist of hardware, software, or a combination of hardware and software. Although, codec 1635 is depicted as a separate component, codec 1635 may be contained within non-volatile memory 1612. By way of illustration, and not limitation, non-volatile memory 1612 can include read only memory (ROM), programmable ROM (PROM), electrically programmable ROM (EPROM), electrically erasable programmable ROM (EEPROM), or flash memory. Volatile memory 1610 includes random access memory (RAM), which acts as external cache memory. According to present aspects, the volatile memory may store the write operation retry logic (not shown in FIG. 16) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1602 may also include removable/non-removable, volatile/non-volatile computer storage medium. FIG. 16 illustrates, for example, disk storage 1614. Disk storage 1614 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1614 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1614 to the system bus 1608, a removable or non-removable interface is typically used, such as interface 1616. It is appreciated that storage devices 1614 can store information related to a user. Such information might be stored at or provided to a server or to an application running on a user device. In one embodiment, the user can be notified (e.g., by way of output device(s) 1636) of the types of information that are stored to disk storage 1614 and/or transmitted to the server or application. The user can be provided the opportunity to opt-in or opt-out of having such information collected and/or shared with the server or application (e.g., by way of input from input device(s) 1628).

It is to be appreciated that FIG. 16 describes software that acts as an intermediary between users and the basic computer resources described in the suitable operating environment 1600. Such software includes an operating system 1618. Operating system 1618, which can be stored on disk storage 1614, acts to control and allocate resources of the computer system 1602. Applications 1620 take advantage of the management of resources by operating system 1618 through program modules 1624, and program data 1626, such as the boot/shutdown transaction table and the like, stored either in system memory 1606 or on disk storage 1614. It is to be appreciated that the claimed subject matter can be implemented with various operating systems or combinations of operating systems.

A user enters commands or information into the computer 1602 through input device(s) 1628. Input devices 1628 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1604 through the system bus 1608 via interface port(s) 1630. Interface port(s) 1630 include, for example, a serial port, a parallel port, a game port, and a universal serial bus (USB). Output device(s) 1636 use some of the same type of ports as input device(s) 1628. Thus, for example, a USB port may be used to provide input to computer 1602 and to output information from computer 1602 to an output device 1636. Output adapter 1634 is provided to illustrate that there are some output devices 1636 like monitors, speakers, and printers, among other output devices 1636, which require special adapters. The output adapters 1634 include, by way of illustration and not limitation, video and sound cards that provide a means of connection between the output device 1636 and the system bus 1608. It should be noted that other devices and/or systems of devices provide both input and output capabilities such as remote computer(s) 1638.

Computer 1602 can operate in a networked environment using logical connections to one or more remote computers, such as remote computer(s) 1638. The remote computer(s) 1638 can be a personal computer, a server, a router, a network PC, a workstation, a microprocessor based appliance, a peer device, a smart phone, a tablet, or other network node, and typically includes many of the elements described relative to computer 1602. For purposes of brevity, only a memory storage device 1640 is illustrated with remote computer(s) 1638. Remote computer(s) 1638 is logically connected to computer 1602 through a network interface 1642 and then connected via communication connection(s) 1644. Network interface 1642 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1644 refers to the hardware/software employed to connect the network interface 1642 to the bus 1608. While communication connection 1644 is shown for illustrative clarity inside computer 1602, it can also be external to computer 1602. The hardware/software necessary for connection to the network interface 1642 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

Some representative embodiments may include a method for a memory device, comprising: receiving, by a memory device comprising a controller, a read command comprising an instruction to read data from a memory array comprising a multi-level cell (MLC) characterized by measurable states of the MLC representing multiple bits of information; receiving, by the memory device, the data and associated parity data from the memory array; separating, by the memory device, the data into codewords associated with an error-correcting code (ECC), wherein a first codeword of the codewords comprises a first bit of the multiple bits and a second codeword of the codewords comprises a second bit of the multiple bits; and providing, by the memory controller, the codewords and associated parity data to a decoder associated with the ECC.

Some embodiments may include separating the data into a defined number of codewords determined based on a count of the multiple bits. Some embodiments may include determining an error included in a portion of the codewords and correcting an associated portion of the data. Some embodiments may include transmitting the data to a host associated with the read command.

Other representative embodiments may include a method for a memory device, comprising: receiving, by the memory device comprising a controller, a write command comprising data and an instruction to write the data to a memory array comprising a multi-level cell (MLC) characterized by measurable states of the MLC representing multiple bits of information; generating, by the memory device, parity data for the data that comprises an error-correcting code (ECC); and generating, by the memory device, split data, wherein a first portion of the split data comprises a first bit of the multiple bits and a second portion of the split data comprises a second bit of the multiple bits.

Some embodiments may include generating the split data comprises separating the data into a defined number of portions, including the first portion and the second portion, determined based on a count of the multiple bits. Some embodiments may include writing, by the memory device, the split data and the parity data to the memory array.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory device, comprising:
   a controller device that interfaces to a host device and to an array of memory cells, wherein each memory cell comprises a multi-level cell (MLC), wherein the MLC is characterized by a plurality of measurable states represented by multiple bits of data;
   a splitter component that generates split data characterized by assigning a first bit of the multiple bits of data to a first codeword of a page of memory and a second bit of the multiple bits of data to a second codeword of the page of memory; and
   an error-correcting code (ECC) component that detects and corrects bit errors associated with the multiple bits of data in response to the first codeword, the second codeword and an ECC algorithm.

2. The memory device of claim 1, wherein the MLC is a resistive two-terminal memory cell.

3. The memory device of claim 1, wherein the ECC algorithm is at least one of a Hamming code, a Bose-Chaudhuri-Hocquenghem (BCH) code, a Reed-Solomon (RS) code, or a low-density parity check (LDPC) code.

4. The memory device of claim 1, wherein the splitter component splits the multiple bits of data into a number of codewords in response to a number of bits in the multiple bits of data.

5. The memory device of claim 1, wherein the splitter component splits the multiple bits of data in response to a memory operation received by the controller device.

6. The memory device of claim 5, wherein the memory operation is a write operation characterized by an instruction to write the multiple bits of data to the MLC.

7. The memory device of claim 6, wherein the splitter component receives the multiple bits of data, generates the split data, and transmits the split data to an encoder component that generates parity data for the split data according to the ECC algorithm.

8. The memory device of claim 7, wherein the splitter component transmits the split data to multiple encoder components that generate the parity data for the split data in parallel.

9. The memory device of claim 7, wherein the controller component transmits the multiple bits of data and the parity data to the array of memory cells.

10. The memory device of claim 6, wherein the splitter component receives the data from an encoder component that generates parity data for the data according to the ECC algorithm and generates the split data.

11. The memory device of claim 10, wherein the controller component transmits the split data and the parity data to the array of memory cells.

12. The memory device of claim 5, wherein the memory operation is a read operation characterized by an instruction to read the multiple bits of data from the MLC.

13. The memory device of claim 12, wherein the splitter component receives the multiple bits of data, generates the split data, and transmits the split data to a decoder component that receives associated parity data and decodes the split data according to the ECC algorithm.

14. The memory device of claim 13, wherein the splitter component transmits the split data to multiple decoder components that decode the split data in parallel.

15. The memory device of claim 13, wherein the decoder component determines a split bit of the split data has an error, determines a correction to the split bit, and the controller device updates a data bit of the multiple bits of data that corresponds to the split bit according to the correction.

16. The memory device of claim 12, further comprising a gatherer component that receives the split data, generates the multiple bits of data characterized by assigning another first bit of the split data to another first codeword of the ECC algorithm and another second bit of the split data to another second codeword of the ECC algorithm, and transmits the multiple bits of data to a decoder component that receives associated parity data and decodes the data according to the ECC algorithm.

17. The memory device of claim 16, wherein the gatherer component transmits the multiple bits of data to multiple decoder components that decode the data in parallel.

18. The memory device of claim 16, wherein the decoder component determines a data bit of the multiple bits of data has an error, determines a correction to the data bit, and the controller device updates the data bit.

19. A method for a memory device, comprising:
receiving, by the memory device comprising a controller, a write command comprising a page of data and an instruction to write the page of data to a memory array comprising a multi-level cell (MLC) characterized by measurable states of the MLC representing multiple bits of information, wherein the multiple bits of information are addressable by a single page operation;
separating, by the memory device, the page of data into codewords associated with an error-correcting code (ECC), wherein a first codeword of the codewords comprises a first bit of the multiple bits and a second codeword of the codewords comprises a second bit of the multiple bits; and
generating, by the memory device, parity data for the codewords that comprises first parity data for the first codeword and second parity data for the second codeword according to the ECC.

20. The method of claim 19, wherein the separating the page of data into codewords separates the page of data into a defined number of codewords determined based on a count of the multiple bits.

21. The method of claim 19, further comprising writing the page of data and the parity data to the memory array.

22. A method for a memory device, comprising:
receiving, by the memory device comprising a controller, a write command comprising data and an instruction to write the data to a memory array comprising a multi-level cell (MLC) characterized by measurable states of the MLC representing multiple bits of information that are addressable by a single page operation;
generating, by the memory device, parity data for the data that comprises an error-correcting code (ECC); and
generating, by the memory device, split data, wherein a first portion of the split data comprises a first bit of the multiple bits and a second portion of the split data comprises a second bit of the multiple bits.

23. The method of claim 22, wherein the generating the split data comprises separating the data into a defined number of portions, including the first portion and the second portion, determined based on a count of the multiple bits.

24. The method of claim 22, further comprising writing, by the memory device, the split data and the parity data to the memory array.

* * * * *